United States Patent
Brace et al.

(10) Patent No.: US 10,248,299 B2
(45) Date of Patent: Apr. 2, 2019

(54) ENSURING TUNNEL DESIGNS STAY WITHIN SPECIFIED DESIGN PARAMETERS AND TOLERANCES

(71) Applicant: Dassault Systemes Canada Inc., Montreal (CA)

(72) Inventors: Jeffrey Y. Brace, Vancouver (CA); David S. Dufty, Vancouver (CA); Aaron M. Isabel, North Vancouver (CA)

(73) Assignee: DASSAULT SYSTEMES CANADA INC., Montreal, QC (CA)

( * ) Notice: Subject to any disclaimer, the term of this patent is extended or adjusted under 35 U.S.C. 154(b) by 329 days.

(21) Appl. No.: 14/937,124

(22) Filed: Nov. 10, 2015

(65) Prior Publication Data
US 2017/0131875 A1     May 11, 2017

(51) Int. Cl.
*G06F 3/00*     (2006.01)
*G06F 3/0484*     (2013.01)
(Continued)

(52) U.S. Cl.
CPC ...... *G06F 3/04845* (2013.01); *G06F 3/04815* (2013.01); *G06F 3/04842* (2013.01);
(Continued)

(58) Field of Classification Search
CPC ............. G06F 3/04845; G06F 3/04815; G06F 3/04842; G06F 3/04847
See application file for complete search history.

(56) References Cited

U.S. PATENT DOCUMENTS

| 5,430,953 A * | 7/1995 | de Souza | G01B 5/30 33/1 PT |
| 9,292,017 B2 * | 3/2016 | Preston | G05D 1/0212 |

(Continued)

OTHER PUBLICATIONS

3D Modelling of Geological Structures for Underground Caverns: A New and Simple Methodology: Vaskou: Oct. 2010: ResearchGate.*

(Continued)

*Primary Examiner* — Nicholas Augustine
(74) *Attorney, Agent, or Firm* — Hamilton, Brook, Smith & Reynolds, P.C.

(57) ABSTRACT

The present invention is directed to a computer system and methods for designing a tunnel in accordance with tunnel design parameters. The computer system and methods load a tunnel design as a visual model of a respective tunnel on a user interface. The computer system and methods enable a user to select a point on the user interface, such that the point defines one or more objects of the visual model. The computer system and methods further enable the user, using a pointing device, to move the point toward a desired location on the user interface, such that the pointing device traverses a plurality of locations on the user interface. As the pointing device traverses each of the plurality of locations, the computer system and methods provide a real-time preview of the respective placement of the selected point and the one or more defined objects on the user interface. If the computer system or methods determine that the respective placement fails to conform to specified tunnel design parameters, the computer system and methods may: prevent the preview from updating to the respective location, automatically fix the respective placement in the preview to conform to the specific tunnel design parameters, or visually indicate in the preview the one or more defined objects that fail to conform.

20 Claims, 23 Drawing Sheets

(51) Int. Cl.
*G06F 9/451* (2018.01)
*G06F 3/0481* (2013.01)
*G06F 17/50* (2006.01)
*G06F 3/01* (2006.01)

(52) U.S. Cl.
CPC .......... *G06F 3/04847* (2013.01); *G06F 9/453* (2018.02); *G06F 17/50* (2013.01); *G06F 17/5004* (2013.01)

(56) References Cited

U.S. PATENT DOCUMENTS

| | | | | |
|---|---|---|---|---|
| 2009/0198505 A1* | 8/2009 | Gipps | ............... | G06Q 10/047 705/1.1 |
| 2009/0229819 A1* | 9/2009 | Repin | ............... | E21B 47/00 166/250.01 |
| 2011/0175899 A1* | 7/2011 | Bittar | ............... | E21B 47/00 345/419 |
| 2013/0018585 A1* | 1/2013 | Zhdanov | ............... | G01V 3/083 702/2 |
| 2014/0120943 A1* | 5/2014 | Shima | ............... | G01S 19/14 455/456.1 |
| 2014/0132633 A1* | 5/2014 | Fekete | ............... | G06T 11/60 345/634 |
| 2014/0155098 A1* | 6/2014 | Markham | ............... | H04B 1/0064 455/456.3 |
| 2015/0254861 A1* | 9/2015 | Chornenky | ............... | G01C 15/00 348/135 |
| 2015/0338549 A1* | 11/2015 | Li | ............... | G01V 99/005 703/6 |
| 2016/0003008 A1* | 1/2016 | Uribe | ............... | E21B 43/00 175/50 |
| 2016/0179336 A1* | 6/2016 | Ambrus | ............... | G02B 27/017 715/768 |
| 2016/0333690 A1* | 11/2016 | Puura | ............... | G01S 17/42 |

OTHER PUBLICATIONS

European Search Report for EP 16 19 7623 dated Mar. 10, 2017, "Ensuring Tunnel Designs Stay Within Specified Design Parameters and Tolerances".
www.pentagonsolutions.com/media/1122/road-design-with-autocad-civil-3d-whitepaper.pdf "Road Design with AutoCAD Civil 3D 2013". Retrieved from Internet Mar. 8, 2017.
http://aucache.autodesk.com/au2011/sessions/4678/class_handouts/v2_CI4678 Lendvorsky, et al. "Tunnel Design using AutoCAD Civil 3D". Retrieved from Internet Mar. 10, 2017.

* cited by examiner

Gradient limits

Minimum ± gradient   10%

Maximum ± gradient   100%

FIG. 3A

Gradient transition limits between segments

Maximum ± transition between segments   2%

Minimum transition segment length   10.00

☑ Automatically smooth vertical transitions

FIG. 3B

Turning radius limit

Minimum turning radius   10.00

FIG. 3C

Corner angle limit

Maximum angle between segments   60°

☑ Replace with an arc when maximum angle exceeded

FIG. 3D

☑ Prevent tunnels from exceeding tunnel parameters and tolerances

FIG. 3E

CHECKING MAXIMUM HORIZONTAL ANGLE

DETERMINING MINIMUM DISTANCE

DIAGRAM 710: TUNNEL CORNER ANGLE LIMIT
ADDING NEW STRAIGHT TUNNEL SEGMENT
MAXIMUM HORIZONTAL ANGLE BETWEEN
  SEGMENTS = 60°
MINIMUM TURNING RADIUS = 20m
AUTOMATICALLY REPLACE CORNER ANGLE
WITH ARC WHEN MAXIMUM EXCEEDED = OFF
PREVENT TUNNELS FROM EXCEEDING TUNNEL
PARAMETERS AND TOLERANCES = OFF

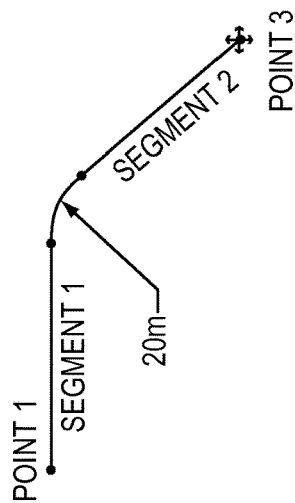

DIAGRAM 712: TUNNEL CORNER ANGLE LIMIT
ADDING NEW STRAIGHT TUNNEL SEGMENT
MAXIMUM HORIZONTAL ANGLE BETWEEN
  SEGMENTS = 60°
MINIMUM TURNING RADIUS = 20m
AUTOMATICALLY REPLACE CORNER ANGLE
WITH ARC WHEN MAXIMUM EXCEEDED = ON
(SHARP CORNER WAS REPLACED WITH 20m RADIUS
ARC WHEN 60° ANGLE WAS EXCEEDED)
PREVENT TUNNELS FROM EXCEEDING TUNNEL
PARAMETERS AND TOLERANCES = OFF

SYSTEM AUTOMATICALLY FIXES THE NON-CONFORMING DESIGN

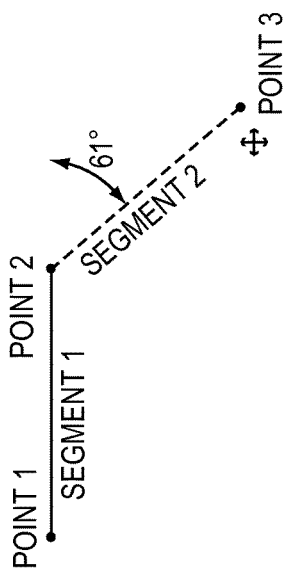

FIG. 7A

PLAN/TOP VIEW OF 3D TUNNEL
POINT 1 AND 3 ARE STATIONARY AND POINT 2 IS AN EXISTING TUNNEL VERTEX BEING MOVED.

DIAGRAM 720: TUNNEL CORNER ANGLE LIMIT
MOVING EXISTING TUNNEL VERTEX
MAXIMUM HORIZONTAL ANGLE BETWEEN
  SEGMENTS = 60°
MINIMUM TURNING RADIUS = 20m
AUTOMATICALLY REPLACE CORNER ANGLE
WITH ARC WHEN MAXIMUM EXCEEDED = OFF
PREVENT TUNNELS FROM EXCEEDING TUNNEL
PARAMETERS AND TOLERANCES = OFF

DIAGRAM 722: TUNNEL CORNER ANGLE LIMIT
MOVING EXISTING TUNNEL VERTEX
MAXIMUM HORIZONTAL ANGLE BETWEEN
  SEGMENTS = 60°
MINIMUM TURNING RADIUS = 20m
AUTOMATICALLY REPLACE CORNER ANGLE
WITH ARC WHEN MAXIMUM EXCEEDED = ON
(SHARP CORNER WAS REPLACED WITH 20m RADIUS
ARC WHEN 60° ANGLE WAS EXCEEDED)
PREVENT TUNNELS FROM EXCEEDING TUNNEL
PARAMETERS AND TOLERANCES = OFF

SYSTEM AUTOMATICALLY FIXES THE NON-CONFORMING DESIGN

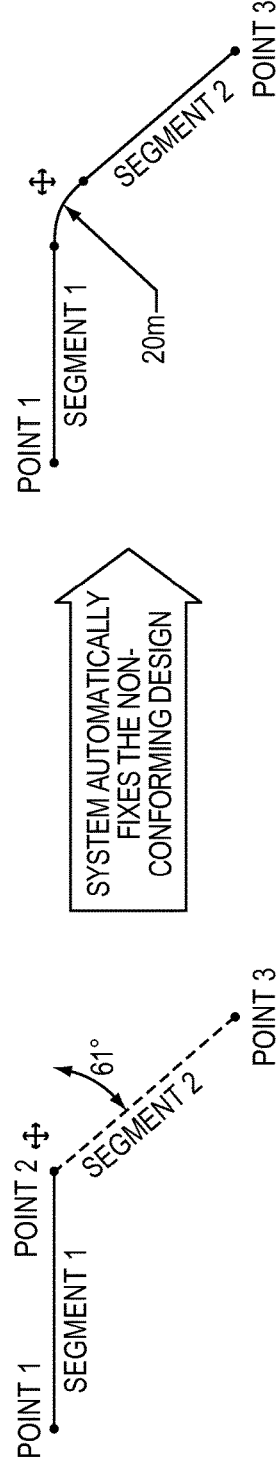

FIG. 7B

ENSURING TUNNEL DESIGNS STAY WITHIN SPECIFIED DESIGN PARAMETERS AND TOLERANCES

BACKGROUND OF THE INVENTION

In the mining industry, a tunnel design must conform to specific tunnel design parameters to ensure that the tunnel design meets industry standards for construction. For example, the tunnel segments of a tunnel design must conform to particular gradient design limits to ensure that the tunnel segments are feasible and safe for the mining operations. Prior tunnel design systems and methods may allow a mining engineer to create or modify tunnel designs based on specific tunnel design parameters. However, after using these systems and methods to create or modify the tunnel design, the mining engineer still needs to manually check and confirm that each portion of the tunnel design actually conforms to the specific tunnel design parameters. For mining engineers manually checking the tunnel design is not an efficient or cost effective method for confirming that the tunnel design conforms to the requisite tunnel design parameters. Further, the mining engineer manually checking the tunnel design is likely to miss errors in the tunnel design, resulting in the construction of tunnels not meeting the industry standards that ensure feasibility and safety.

SUMMARY OF THE INVENTION

The present invention addresses the problems of prior tunnel design systems and methods by ensuring that the specified tunnel design parameters are conformed to during the creation and modification of the tunnel design. Specifically, the present invention provides real-time feedback and guidance during the creation and modification of the tunnel design, which includes real-time detection of additions and modifications to the tunnel design that fail to conform to the specific tunnel design parameters. The present invention provides such detection by performing real-time, precise checking of the additions or modifications against each of the requisite tunnel design parameters, as the mining engineer is in the process of making the additions and modification to the tunnel design (prior to committing the tunnel design). The present invention then provides real-time, visual feedback to inform the mining engineer of particular portions of the tunnel design that fail to conform to the requisite (or specific) tunnel design parameters and the precise reason that the portion fails to conform. The present invention may also be configured to prevent the mining engineer from adding to or modifying the tunnel design in a manner that fails to conform to the specific tunnel design parameters. Further, in regards to certain tunnel design parameters, the present invention may automatically fix the tunnel design, in real-time, such that the additions and modifications dynamically conform to the requisite/specific tunnel design parameters.

Therefore, unlike prior tunnel design systems and methods, the mining engineer does not have the inefficient, costly, and error-prone task of manually checking and confirming that each portion of the tunnel design actually conforms to the specific tunnel design parameters. Rather, the present invention's real-time, precise feedback and response to the tunnel design in process not conforming to the specific tunnel design parameters ensure the production of tunnel designs that meet the industry standards for feasibility and safety.

The present invention is directed to a computer system and methods for designing a tunnel in accordance with tunnel design parameters. The computer system and methods may include at least one processor communicatively coupled to a user interface and to computer memory for designing the tunnel. To design the tunnel, the computer system and methods provide requisite tunnel design parameters for the tunnel design, which the computer system and methods ensure are maintained during the creation and modification of the tunnel design. The computer system and methods may load the specific (requisite) tunnel design parameters and their respective tolerances from the computer memory, as default or saved values, or enable a user to specify the requisite tunnel design parameters and their respective tolerances at the user interface. If the user specifies the requisite tunnel design parameters, the computer system and methods may update the computer memory to save the requisite/specific tunnel design parameters and the respective tolerances for future modifications of the tunnel design. The requisite/specific tunnel design parameters may include: gradient limits, gradient transition limits between segments, turning radius limits, corner angle limits between segments, and any other such tunnel design parameters.

The computer system and methods further load from the computer memory the subject tunnel design. The tunnel design may be an existing tunnel design being loaded for modification, or a new tunnel design being loaded as a blank template or other initial format. The computer system and methods present the tunnel design displayed on the user interface as a visual model of a respective tunnel. The visual model may be a three-dimensional (3D) visual model being presented on the user interface in 3D space. The computer system and methods then receive user input representative of the selection of a point on the user interface. For example, the computer system and methods may enable a user (e.g., mining engineer) or other computer system to select a point on the user interface that defines one or more objects of the visual model. The selected point may be a modeled point of the tunnel design, such as a modeled tunnel vertex or a modeled endpoint of a tunnel segment. The one or more defined objects may be one or more modeled tunnel segments of the subject tunnel design that are defined by the selected point. The computer system and methods further enable moving the selected point by receiving user input representative of movement of the selected point toward a desired location on the user interface, such that the user input causes the point to traverse a plurality of locations on the user interface. The user input may be received by a user using a pointing device (e.g., mouse).

As the selected point traverses each of the plurality of locations, the computer system and methods provide a real-time preview of the respective placement of the selected point and the one or more defined objects, if the respective location is selected for placing the point. As part of the real-time preview displayed on the user interface, the computer system and methods perform a real-time determination of whether the respective placement of the one or more defined objects conforms to the requisite tunnel design parameters. If the real-time determination by the computer system or methods indicates that the respective placement fails to conform to the requisite tunnel design parameters, the computer system and methods may respond in the preview in various ways. In some embodiments, the computer system and methods may automatically fix, in the preview on the user interface, the respective placement of the one or more defined objects to conform to the tunnel design parameter. For example, the automatic fixing of the respective placement may include automatically smoothing a gradient transition, when the gradient transition fails to conform to a requisite gradient transition limits parameter. For another example, the automatic fixing of the respective placement of the one or more defined objects may also include automatically replacing a corner angle with an arc, when the corner angle fails to conform to a requisite corner angle limits parameter. In some embodiments, the computer system and methods may prevent the preview on the user interface from updating to display the traversed location of the pointing device that would cause the non-conformity. In other embodiments, the computer system and methods may visually indicate (e.g., highlight in red or other visual effect) in the preview on the user interface, the one or more defined objects that fail to conform to the requisite/specific tunnel design parameters.

The computer system and methods may further receive user input representative of selecting one location of the plurality of previewed locations in a manner that digitizes the selected point at the one selected location. The digitizing adjusts the one or more defined objects to the respective previewed placement in the visual model as displayed on the user interface. In embodiments, the adjusting of the one or more defined objects results in one or more of: extending a defined object, changing angles between defined objects, changing gradient of a defined object, and changing radius of a defined object. If the adjusted placement of the one or more defined objects fails to conform to the requisite/ specific tunnel design parameters, the computer system and methods may visually indicate the failure in the respective portion of the visual model on the user interface. The computer systems and method may further update the tunnel design, in the computer memory, to reflect the adjusted placement of the one or more defined objects.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 3A-3E illustrate example user interfaces for configuring requisite tunnel design parameters (defining constraints or constraining limits) used in embodiments of the present invention.

FIGS. 7A-7C are diagrams depicting example methods for fixing tunnel corner angles that exceed the tunnel corner angle limit design parameter in embodiments of the present invention.

DETAILED DESCRIPTION OF THE INVENTION

A description of example embodiments of the invention follows.

Overview Method of Tunnel Design

Figure 1A:
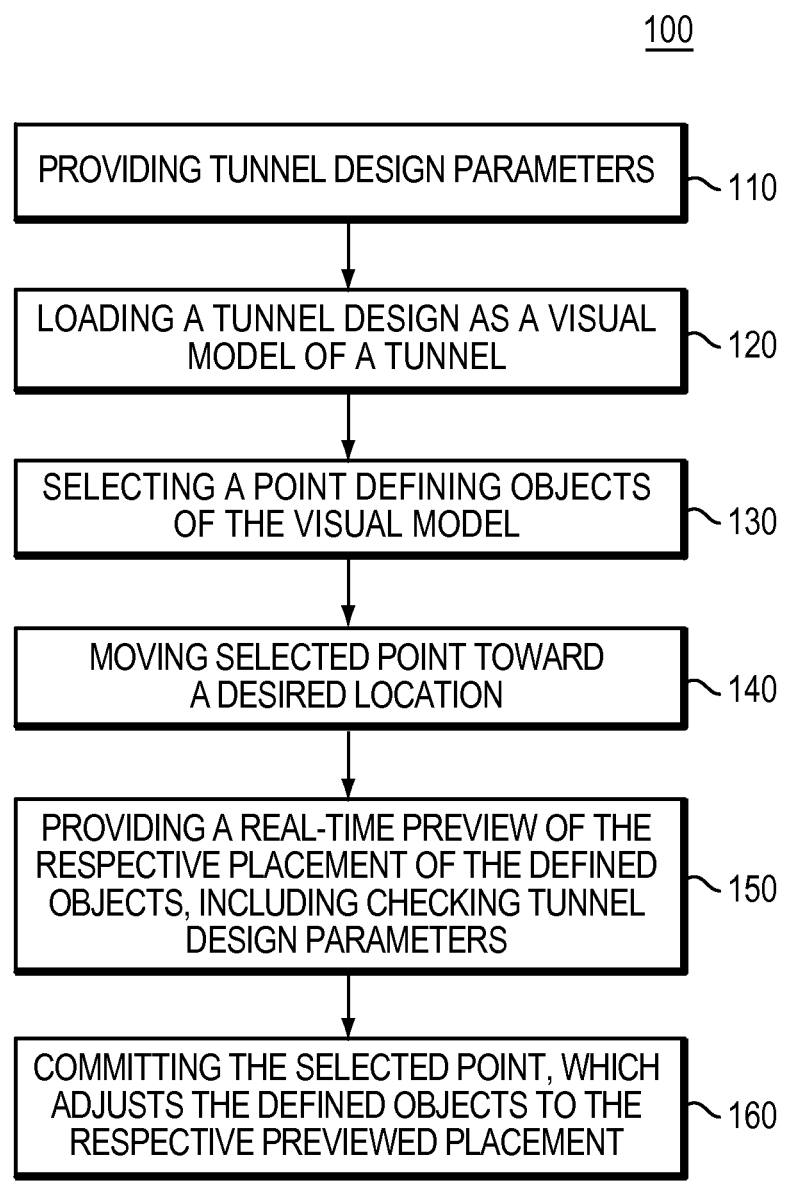
FIG. 1A illustrates a flow chart of an example overview computer-implemented method of designing a tunnel in embodiments of the present invention.

FIG. 1A illustrates a flow chart of an example overview method 100 of designing a tunnel in embodiments of the present invention. The method 100 may be executed by a computer system communicatively coupled to a user interface and memory. The computer system may be a system specifically implemented for the creation, visualization, modification, and storage of tunnel designs for industry operations, such as mining operations. The computer system may also be specifically implemented to provide these functions in a three-dimensional (3D) space, including the user interface of the system providing a display of the tunnel design as a visual 3D model.

The computer-implemented method 100 begins at step 110 by requisite or specific tunnel design parameters being provided by the computer system. The tunnel design parameters are ranges and tolerances that must be maintained while modifying components (e.g., tunnel segments) of a tunnel design. The tunnel design parameters may include ranges and tolerances for one or more of: gradient limits (with "minimum±gradient" and "maximum±gradient" tolerance options), gradient transition limits between segments (with "maximum±transition between segments" and "minimum transition segment length" tolerance options), turning radius limit (with a "minimum turning radius" tolerance option), and corner angle limits (with a "maximum angle between segments" tolerance option), or other such tunnel design limits. For example, if as part of modifying a tunnel design, a user moves a tunnel segment in a manner that changes the angle between the tunnel segment and an adjacent tunnel segment, the changes to the angle must be maintained within the corner angle limits specified in the tunnel design parameters. The computer system may load default or saved values for the requisite/specific tunnel design parameters from memory, and provide options on the user interface for a user to specify or adjust the loaded tunnel design parameters.

The computer system may then execute step 120 of method 100 by loading a tunnel design as a visual model of a respective tunnel. Note, in some embodiments, the loading of the tunnel design of step 120 may be performed before the providing of the tunnel design parameters of step 110. The loading of the visual model may be initiated by a user of the system selecting load options via the user interface. In some embodiments, the visual model represents an existing tunnel design stored in the memory of the system, or another system communicatively coupled to the system. The stored tunnel design includes data that defines the positioning of components (e.g., tunnel segments) in a respective tunnel. For example, the data may include a location of a tunnel vertex, parameters defining where an arc radius of a curved tunnel segment is tangent to adjacent tunnel segments, or other such tunnel design data. In these embodiments, the system loads the visual model by retrieving the stored tunnel design data, and converting the data into the visual model displayed on the user interface of the system. The visual model may be displayed as a combination of objects (e.g., lines, arcs, points, and solid surfaces) that represent components (e.g., tunnel segments and tunnel vertices) of the tunnel of the respective tunnel design. The display of the visual model may be further based on the tunnel type, the tunnel state, errors that exist in the tunnel design, and user options related to the display of the visual model. In other embodiments, the visual model represents a new tunnel design, which may be presented at the user interface as a blank template or other initial model format.

Once the system loads the tunnel model at step 120, a user of the system may modify the visual model. The user may modify the visual model by moving, or otherwise altering, existing objects in the visual model or by adding new objects to the visual model. To modify the visual model, at step 130 of method 100, the user may select a point defining one or more objects of the visual model. For example, the user may select an endpoint of a tunnel segment, which defines that respective tunnel segment, or the user may select a vertex point between two tunnel segments, which defines both tunnel segments. For another example, the user may select a new point on the user interface to add a new segment connected to an existing segment endpoint, such that the new point defines the new tunnel segment. The user may select the point by use of a pointing device, such an electronic pointing device (e.g., mouse, cursor control device, etc.), or any other pointing mechanism (e.g., a user's finger in case of a touch screen).

Once the point is selected at step 130, then at step 140 of method 100, the user may move the pointing device to move the point toward a desired location. As the pointing device moves the point toward the desired location, the pointing device traverses a plurality of other locations. If the user chooses to place the selected point at one of the traversed locations, the adjusted placement of the point would also result in a respective adjusted placement of the one or more objects defined by the point. For example, the adjusted placement of the point may result in extending an object defined by the point, changing the angle between two objects defined by the point, changing the gradient of an object defined by the point, or changing the radius of an object defined by the point. At step 150 of method 100, as the pointing device traverses each of the plurality of locations, the system provides a real-time tunnel preview (i.e., preview) of the adjusted placement of the selected point and the one or more defined objects, if the user chooses the respective location. The real-time tunnel preview includes a real-time determination of whether the adjusted placement of the one or more defined objects would conform to the tunnel design parameters.

For example, if the selected point is a tunnel segment endpoint, and if choosing a particular traversed location for the tunnel segment endpoint would cause the respective tunnel segment to not conform with a gradient limits parameter (e.g., exceed maximum vertical gradient), this determination would be made in real-time by the system as part of the preview. In some embodiments, if an adjusted placement of the one or more defined objects would not conform, the system may automatically fix the adjusted placement in the preview, such that the placement of the one or more defined objects would conform to the requisite tunnel design parameters. For example, the tunnel design parameters may include options for automatically fixing tunnel designs that fail to conform to the tunnel design parameters by including one or both of: an "automatically smooth vertical transitions" option for fixing segment transitions that fail to conform to the gradient transition limits and a "replace with an arc when maximum angle exceeded" option for fixing angles between segments that fail to conform with the corner angle limits. In some embodiments, if an adjusted placement of the one or more defined objects would not conform, the system may prevent or constrain the preview from updating to the adjusted placement. In other embodiments, if an adjusted placement of the one or more defined objects would not conform, the system may indicate (e.g., visually, audibly, etc.), at the preview on the user interface, that the adjusted placement would not conform to the requisite tunnel design parameters.

Based on the real-time preview respective to each traversed location, at step 160 of method 100, the user selects a location to commit the selected point for digitizing the adjusted placement. Note, digitizing describes selecting a physical point location in a 3D space and converting the selected 3D point location to a digital format that can be used by the system executing method 100, or a communicatively coupled system, to perform further automatic functions using the tunnel design. The selected location may or may not be the same desired location to which the user was originally moving the selected point toward. The digitizing adjusts the one or more defined objects to the respective previewed, adjusted placement in the visual model. If the adjusted placement does not conform to the requisite/specific tunnel design parameters, the system may indicate the non-conformities at the user interface, such as by highlighting the non-conforming portion of tunnel model. The indicating of the non-conformities may also include other visual indications, such as changing the color, line style, or fill style of the tunnel segment, or changing the pointing device cursor (shape, style, type, etc.). In some embodiments, the user may reload the tunnel design at a later time to fix the objects of the tunnel design that fail to conform to the requisite tunnel design parameters. The system may then update the tunnel design in memory, to reflect the adjusted one or more defined objects in the visual model. The system may also store the original loaded tunnel design, in case it is needed for future tunnel modifications.

Tunnel Design Structuring

Figure 1B:
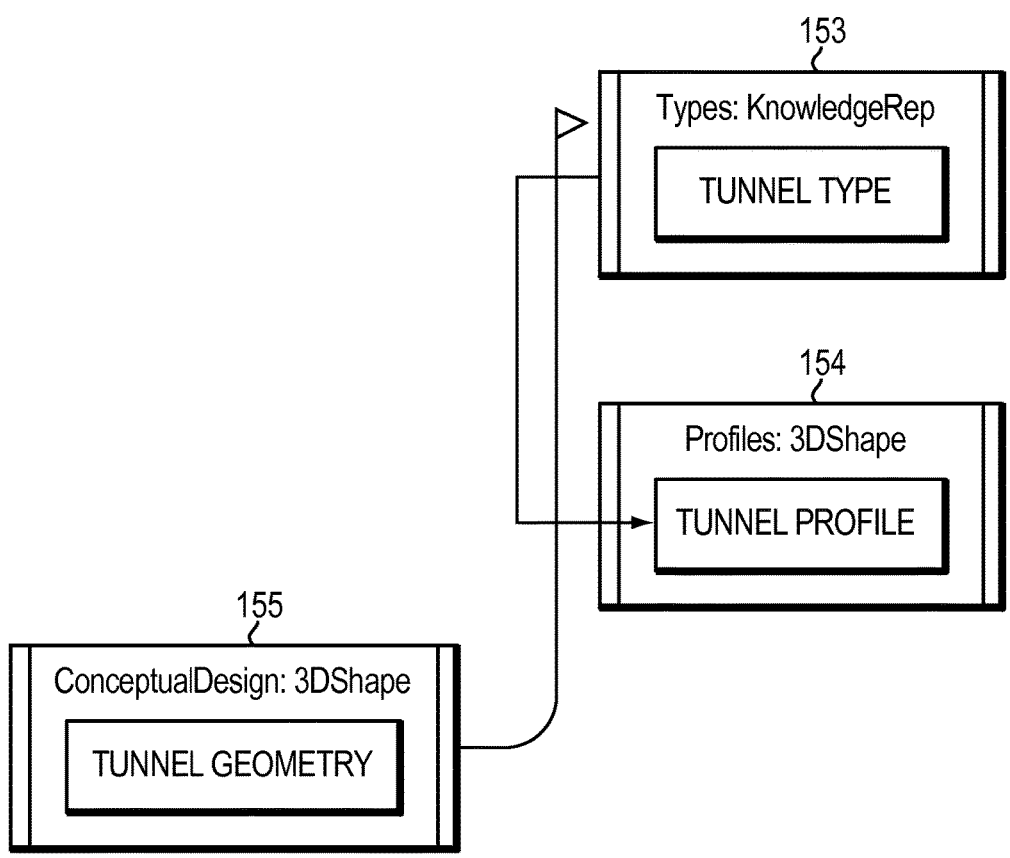
FIGS. 1B-1C illustrate example diagrams of structuring tunnel design data for providing a real-time preview in embodiments of the present invention.
Figure 1C:
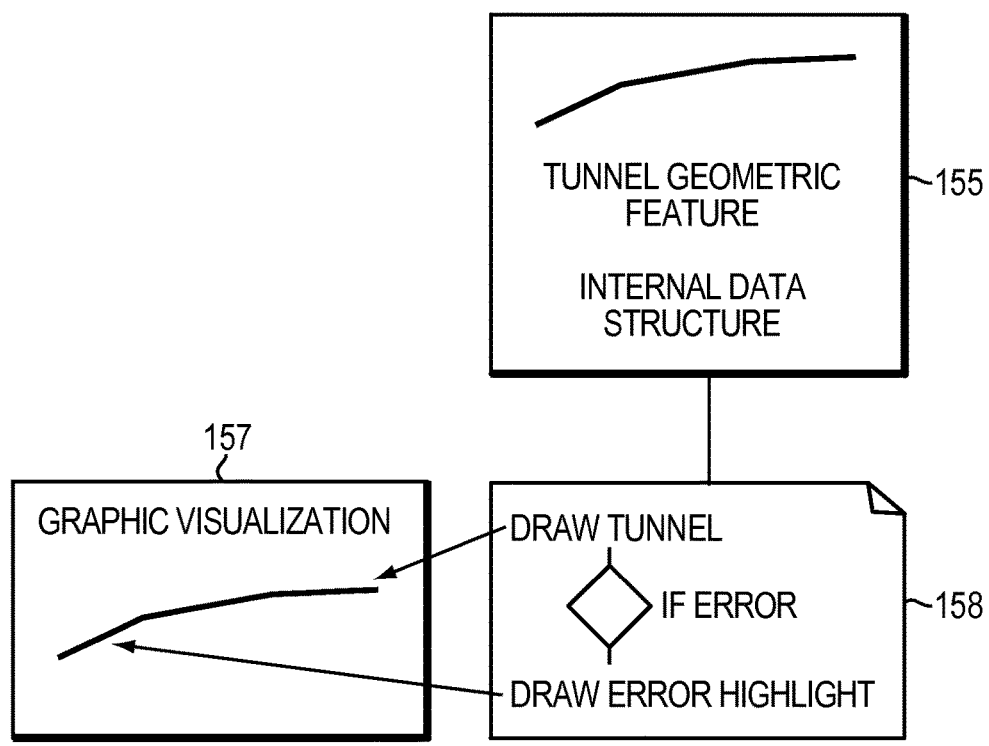

FIGS. 1B-1C illustrate example diagrams of structuring tunnel design data for providing a real-time preview in embodiments of the present invention. Specifically, each tunnel design represents a respective tunnel of a particular tunnel type with a corresponding tunnel profile. As shown in FIG. 1B, the tunnel design data is structured in memory (in the tunnel design structure 152) respective to a given tunnel type stored in a Tunnel Type data structure 153, and linked to a corresponding Tunnel Profile data structure 154 storing the valid detailed properties (e.g., tunnel design parameters) for that particular tunnel type. As such, the tunnel design structure 152 enables each tunnel design of the same tunnel type to reference (and share) the same tunnel type data in the Tunnel Type data structure 153 and corresponding tunnel profile data in the Tunnel Profile data structure 154. Thus, when a visual model is generated for a tunnel design, the centerline geometry for the respective tunnel design is simply created in the Tunnel Geometry data structure 155 of the tunnel design structure 152 and linked to the shared Tunnel Type data structure 153, which in turn is linked to the Tunnel Profile data structure 154 corresponding to the tunnel type of the tunnel design. The shared structuring of the Tunnel Type and corresponding Tunnel Profile data structures 153, 154 provide an efficient organization for checking the tunnel design data (in the Tunnel Type and Tunnel Profile data structures 153, 154) against the current geometry of the tunnel (in the Tunnel Geometry data structure 155). That is, as the user manipulates the geometry of the tunnel design using the visual model, the separation of the tunnel design parameters from the current geometry of the tunnel design enables the tunnel preview to provide real-time queries of the shared tunnel design parameters to determine the validity of those tunnel design parameters against the current geometry of the tunnel design.

Further, as shown in diagram 156 of FIG. 1C, the present invention separates the internal geometric data representation 155 of the tunnel (i.e., Tunnel Geometry data structure) in memory from the visualized representation 157 displayed on the user interface as the visual model. The separation enables a division of responsibilities between the internal geometric data representation 155 in memory and the visualized representation 157, such that the computer system executing the present invention may provide feedback to the user in real-time on the user interface, and do so without needing to corrupt the representation of the tunnel design in memory. For example, such separation between the internal geometric data representation 155 in memory and visualized representation 157 on the user interface enables the visualized representation 157 to be decorated (e.g., visually highlighted in the case of an error) 158 in real-time in the tunnel preview without manipulating the geometric data representation 155 in memory.

Moving Objects in Visual Model of Tunnel Design

Figure 1D:
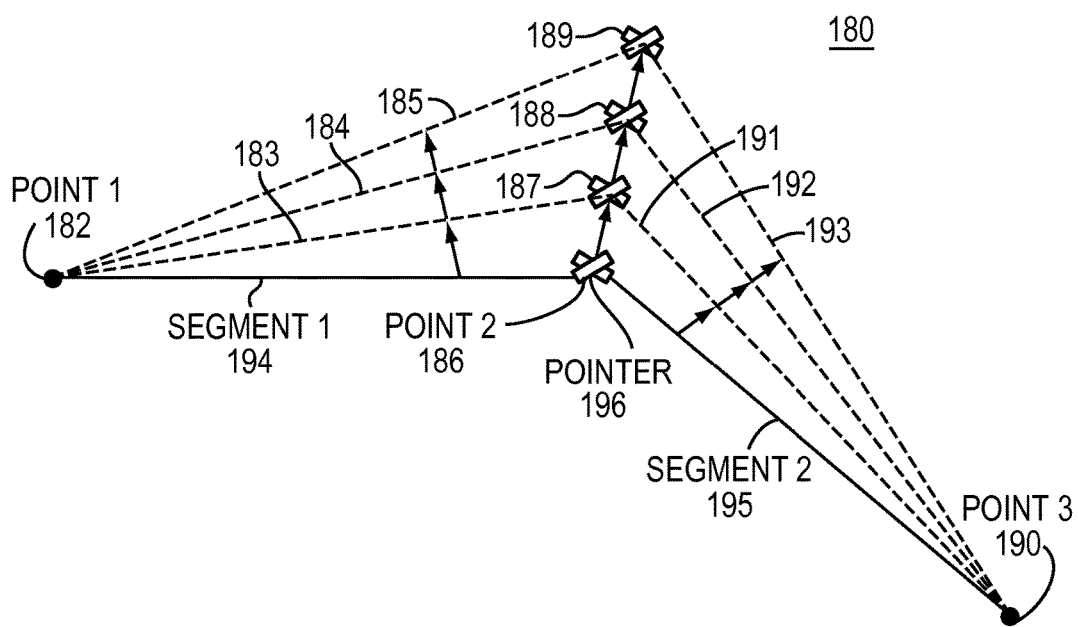
FIG. 1D illustrates an example diagram of a visual model of a tunnel design in embodiments of the present invention.

FIG. 1D illustrates an example diagram of a visual model 180 of a tunnel design that may be modified by method 100 of FIG. 1A in embodiments of the present invention. The visual model 180 includes three points 182, 186, 190 defining objects of the visual model on a user interface. These defined objects represent components (tunnel segments 194, 195) of the respective tunnel design. Point 1 (182) is an endpoint of Segment 1 (194), and, as such, is a point that defines Segment 1 (194). Point 2 (186) is a vertex between Segment 1 (194) and Segment 2 (195), and, as such, is a point that defines both Segment 1 (194) and Segment 2 (195). Point 3 (190) is an endpoint of Segment 2 (195), and, as such, is a point that defines Segment 2 (195).

In FIG. 1D, the vertex, Point 2 (186), is selected by Pointer 196. Pointer 196 then moves the selected Point 2 (186) toward a desired location on the user interface, such that selected Point 2 (186) traverses a plurality of locations 187, 188, 189. As selected Point 2 (186) traverses each of the plurality of locations, a real-time tunnel preview is provided of Point 2 and the objects defined by Point 2 (186), i.e., Segment 1 (194) and Segment 2 (195). As shown in FIG. 1D, as selected Point 2 (186) traverses a first location 187, the real-time tunnel preview shows the adjusted placement 183 of Segment 1 (194) and the adjusted placement 191 of Segment 2 (195), if the user chose the first location 187. Further, as selected Point 2 (186) traverses a second location 188, the real-time tunnel preview shows the adjusted placement 184 of Segment 1 (194) and the adjusted placement 192 of Segment 2 (195), if the user chose the second location 188. Similarly, as selected Point 2 (186) traverses a third location 189, the real-time tunnel preview shows the adjusted placement 185 of Segment 1 (194) and the adjusted placement 193 of Segment 2 (195), if the user chose the third location 189.

The real-time determination, included as part of the real-time tunnel preview, calculates whether the adjusted placements 183, 184, 185 of Segment 1 (194) or the adjusted placements 191, 192, 193 of Segment 2 (195) fails to conform to specified tunnel design parameters. For example, the calculations may find that the adjusted placement 185 of Segment 1 (194) and the corresponding adjusted placement 193 of Segment 2 (195) would fail to conform to the corner angle limit parameter because the angle between Segment 1 (194) and Segment 2 (195) at these placements 185, 193 would exceed the respective maximum angle between segments tolerance. In some embodiments, due to the particular non-conformity, the tunnel preview would still update to location 189 and adjusted placements 185 and 193, but the tunnel previewed would be automatically fixed by replacing the corner angle between Segment 1 (194) and Segment 2 (195) with an arc. In other embodiments, the tunnel preview is prevented from updating to the adjusted placements 185, 193. That is, Pointer 196 moves to location 189, but the tunnel preview instead remains at location 188, and, thus, Segment 1 (194) and Segment 2 (195) remains at adjusted placements 184 and 192, respectively. In yet other embodiments, the tunnel preview would still update to location 189, but would visually indicate the non-conformity by highlighting Segment 1 (194), Segment 2 (195), or both in the tunnel preview of the visual model.

Method of Extending a Tunnel Design within Specified Parameter

Figure 2A:
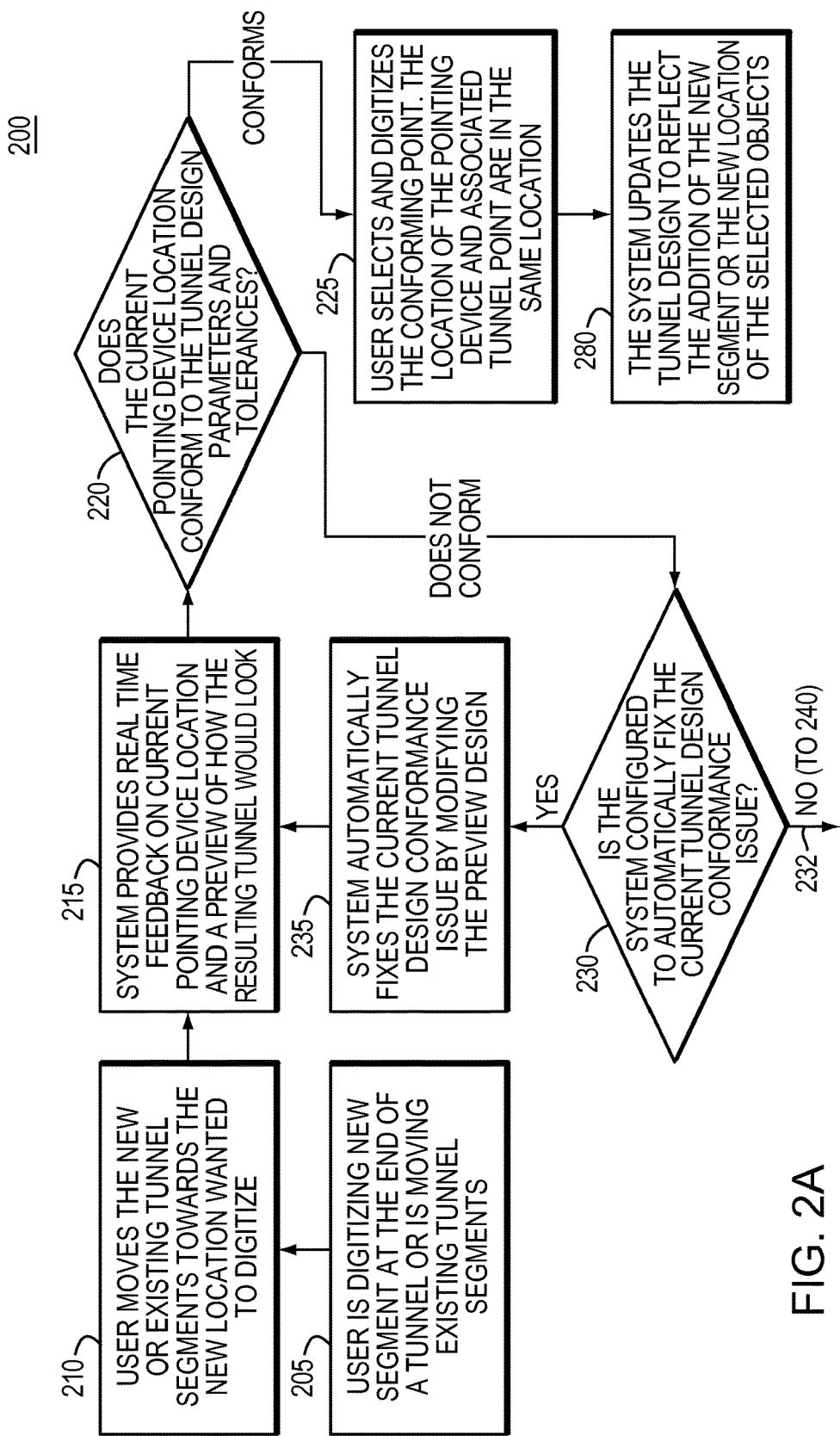
FIGS. 2A-2B illustrate a flow chart of an example computer-based method of extending a tunnel design within specific tunnel design parameters in embodiments of the present invention.
Figure 2B:
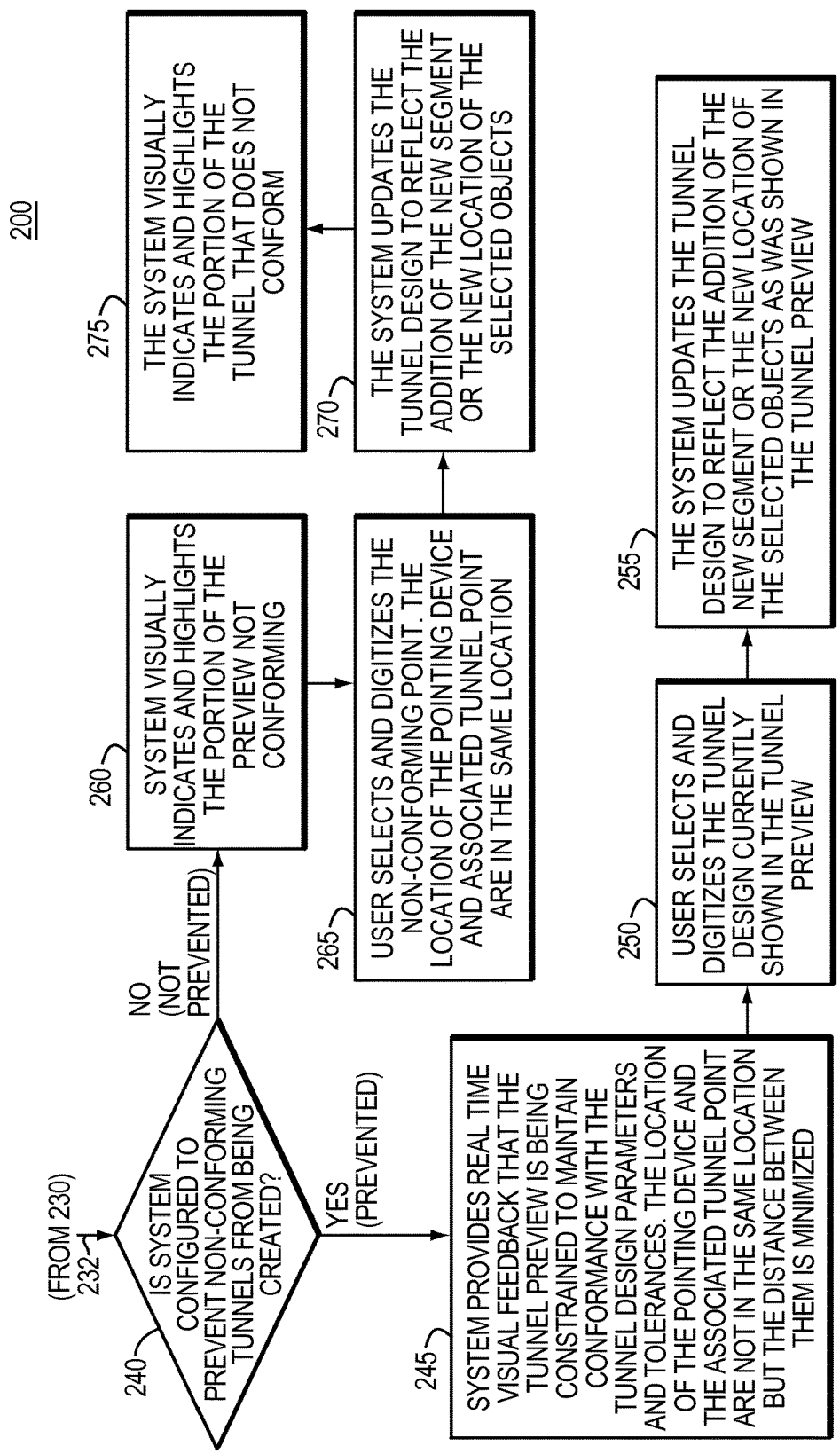

FIGS. 2A-2B illustrates a flow chart of an example computer-based or computer-implemented method 200 of extending a tunnel design within specific tunnel design parameters in embodiments of the present invention. The method 200 may be an embodiment of the overview tunnel design method 100 of FIG. 1. A computer system may execute the method 200 to modify an existing tunnel design loaded from computer memory or a new tunnel design. The modification of the tunnel design may include adding new tunnel objects (e.g., new tunnel segments) to the tunnel design, or modifying existing tunnel objects (e.g., existing segments and vertices) in the tunnel design. A tunnel design is loaded as a visual model at the user interface of the computer system prior to beginning method 200. A computer rendering or display of the visual model results.

Method 200 begins at step 205 (of FIG. 2A) by the user selecting a point on the displayed visual model. In response, the computer system digitizes a new tunnel segment or moves an existing tunnel segment in the visual model. That is, the point may be a new point being placed near the end of the visual model, such that the new point defines a new object being digitized in the visual model. For example, the point may be a new tunnel segment endpoint that defines a new tunnel segment being digitized at the end of an existing tunnel segment. The point may instead be an existing tunnel point that defines one or more existing objects being moved in the visual model. For example, the point may be an existing tunnel vertex defining two tunnel segments (i.e., positioned between the two tunnel segments) being moved to extend the visual model. For a further example, the point may be an existing tunnel segment endpoint that defines an existing tunnel segment being moved to extend the visual model.

At step 210 of method 200 (FIG. 2A), in response to a user command through a pointing device (e.g., a mouse), the system moves the selected new or existing point towards a new location indicated by the user as where he wants to digitize the point. In correspondence with user movement of the pointing device, the system moves the point toward the new location by traversing through a plurality of other locations. If the user chose to place the selected point at one of the traversed locations, the adjusted placement of the point would also result in digitizing a respective adjusted placement of the one or more objects defined by the point. At step 215 (of FIG. 2A), while the user is still moving the pointing device, the system provides real-time visual feedback of the current location being pointed to by the pointing device (and being traversed by the selected point). The real-time feedback being provided as the user moves the pointing device is referred to as a tunnel preview (i.e., preview). The tunnel preview shows the user in real-time how the resulting visual model of the tunnel design would look if the user chose to place the selected point at each traversed location (i.e., a, at the moment, current location of the pointing device). Specifically, in the tunnel preview, the system shows the adjusted placement of respective defined objects in the visual model, as if the user chose to place the selected point respectively for each traversed location.

At step 220 of method 200 (of FIG. 2A), the preview may also indicate to the user, in real-time, if placing the point at a current location being pointed to by the pointing device would cause the respective defined objects to fail to conform to the requisite tunnel design parameters and respective tolerances. To provide this indication, the system continuously calculates, in real-time, if each location traversed by the selected point (i.e., the current location of the pointing device) would conform to each of the tunnel design parameters specified for the tunnel design. That is, the system checks, in real-time, the tolerance of each respective tunnel design parameter separately against the respective placement of the defined one or more objects to determine if a traversed location of the selected point conforms to the tunnel design parameters. For example, if the point is a vertex between two tunnel segments, as the pointing device moves the vertex, the system determines if the placement of the moved vertex at a traversed location would conform to the respective tolerance of each specified tunnel design parameter. For example, the system may check if the vertex at a traversed location would cause the angle between the segments to exceed the tolerance of the tunnel corner angle limit parameter (maximum angle between segments).

If the current location being pointed to by the pointing device conforms to the requisite tunnel design parameters, the system/method 200 then proceeds to step 225 (of FIG. 2A), where the user may select the current location being pointed to by the pointing device. Note, when the user selects the current location, the current location and the associated tunnel preview of the selected point is at the same location. That is, as the current location conforms to the tunnel design parameters, there is no reason to prevent the tunnel preview from updating to that location. The selection of the current location results in the system digitizing the one or more objects defined by the selected point according to the respective previewed placement of the one or more objects. For example, if the selected point is a tunnel vertex, then user selection of the current location results in the system digitizing the segments connected by the vertex according to the respective previewed placement of the tunnel segments. The digitizing updates the visual model to display the one or more objects according to the previewed placement. Then, at step 280 (of FIG. 2A), the system updates the tunnel design in memory to reflect the addition of the new tunnel object or the new location of the tunnel object. If the user chooses to continue adding or moving more tunnel objects, the system continues to repeat the method 200, starting at step 205 (of FIG. 2A), until a visual model of a desired tunnel is created at the system interface, and the corresponding tunnel design is updated in memory.

If at step 220 of method 200 (of FIG. 2A) placing the selected point at a current location being pointed to by the pointing device would cause the respective placement of the defined objects to fail to conform to the requisite tunnel design parameters and respective tolerances, the system proceeds to step 230 (of FIG. 2A). For example, the system may check if the placement of the defined objects would fail to conform to gradient limits, gradient transition limits between segments, turning radius limit, and corner angle limit design parameters. At step 230 (of FIG. 2A), the system checks if an option is configured to automatically fix the non-conformance issues in the tunnel preview. If such as option is configured, at step 235 (of FIG. 2A), the system modifies the tunnel preview to automatically fix the non-conformity of the defined objects based on the configured option. For example, if the selected point is a tunnel vertex, and if the placement of the tunnel vertex at the current location would cause the angle between the two segments connected by the vertex to exceed the tunnel corner limits design parameter ("maximum angle between segments" tolerance option), then the system may automatically fix the non-conforming angle in the preview. That is, if the corner angle limit design parameter is configured such that the option "replace with an arc when maximum angle exceed," or other such option for the corner angle limit design parameter, is set, the angle between the two segments is automatically fixed in the tunnel preview by the system replacing the angle with an arc. For another example, if the selected point is a tunnel segment endpoint, and if the placement of the tunnel segment endpoint at the current location would cause the vertical gradient transition between the respective segment and another segment connected to the respective tunnel segment, to exceed the gradient transition limits design parameters ("maximum ±transition between segments" tolerance option), then the system may automatically fix the vertical gradient transitions of the non-conforming tunnel segments. That is, if the gradient transition limits design parameters are configured such that the option "automatically smooth vertical transitions," or other such option for the gradient transition limits design parameters, is set, the vertical gradient transitions of the non-conforming segments are automatically fixed in the tunnel preview by the system smoothing these transitions.

After the system modifies the tunnel preview to automatically fix the non-conformity, the system proceeds back to step 215 (of FIG. 2A), and the system continues to provide real-time visual feedback of the current location being pointed to by the pointing device (and being traversed by the selected point). Further at step 220 of method 200 (of FIG. 2A), the system continues to check if the preview indicates that placing the selected point at a current location being pointed to by the pointing device would cause the respective defined objects to fail to conform to the tunnel requisite design parameters and tolerances. If at step 220 of method 200 (of FIG. 2A) placing the selected point at a current location being pointed to by the pointing device would cause the respective placement of the defined objects to fail to conform to the tunnel design parameters and tolerances, but there is no option configured to fix the non-conformity of the defined objects, the system proceeds to step 240 (of FIG. 2B). As shown in FIGS. 2A and 2B, step 230 (of FIG. 2A) proceeds to step 240 of FIG. 2B) via the arrow 232 depicted on both FIGS. 2A and 2B. If at step 240 (of FIG. 2B), the system checks to determine if the "prevent tunnels from exceeding tunnel parameters and tolerances" option is set to prevent non-conforming tunnels from being created. If so, this option enables the system to constrain the system from moving the selected point to a current location being pointed to by the pointing device, if that current location would cause a non-conforming placement of the respective defined objects. That is, the tunnel preview would fail to update the placement of the selected point, and respective defined objects, to the current location being pointed to by the pointing device, and thereby prevent the user from selecting that current location for digitizing the selected point.

If this option is not set, then at step 260 (of FIG. 2B), the system allows the user to move the selected point to the current location pointed to by the point device, thereby updating the placement of the selected point and respective defined objects in the tunnel preview. The system then visually indicates by highlighting (or other visual effect) in the tunnel preview the portion of the visual model that does not conform to the tunnel design parameters. For example, if the placement of the selected point would cause the angle between two segments defined by the selected point to exceed the tunnel corner angle limit, the system may highlight (flash, illuminate, etc.) one or both segments, and the respective value of the angle between the segments, to illustrate the non-conformity to the tunnel design parameters. The method 200 then proceeds to step 265 (of FIG. 2B), where the user may select the current location being pointed to by the pointing device. Note, when the user selects the current location, the current location and the associated tunnel preview of the selected point are at the same location. That is, as the current location conforms to the tunnel design parameters, there is no reason to prevent the tunnel preview from updating to that location.

Also at step 265, the selection of the current location results in the system digitizing the one or more objects defined by the selected point according to the respective previewed placement of the one or more objects. For example, if the selected point is a tunnel vertex, then the selection of the current location results in the system digitizing the tunnel segments connected by the vertex according to the respective previewed placement of the tunnel segments. The digitizing updates the visual model to display the one or more objects according to the previewed placement. Then, at step 270 (of FIG. 2B), the system updates the tunnel design in memory to reflect the addition of the new tunnel object or the new location of the tunnel object. At step 275 (of FIG. 2B), the system visually indicates by highlighting or otherwise in the tunnel preview the portion of the visual model that does not conform to the tunnel design parameters. The portions of the visual model visually indicated and highlighted are the same portions that were visually indicated and highlighted in the tunnel preview at step 260 (of FIG. 2B). If the user chooses to continue adding or moving more tunnel objects, then the system continues to repeat the method 200, starting at step 205 (of FIG. 2A), until a visual model of a desired tunnel is digitized at the system interface, and the corresponding tunnel design is updated in memory.

If the "prevent tunnels from exceeding tunnel parameters and tolerances" option is determined to be set at step 240 (of FIG. 2B), then at step 245 (of FIG. 2B), the system prevents the tunnel preview from updating the selected point to the current location pointed to by the pointing device, thereby further preventing the tunnel preview from updating the respective placement of the defined objects. The system provides real-time visual feedback that the tunnel preview is being constrained to maintain conformance with the requisite tunnel design parameters and tolerances. For example, if the selected point is a tunnel segment endpoint, and moving the tunnel segment endpoint to the current location pointed to by the pointing device would cause the segment and a connected, adjacent segment to have a turning radius below the turning radius limit design parameter, then the system prevents the tunnel preview from updating the tunnel segment endpoint to the current location. Note, as the select point is being prevented from being updated in the tunnel preview to the current location pointed to by the pointing device, the location of the pointing device and the associated tunnel point are not in the same location, but instead the system minimizes the distance between the two location in the tunnel preview. Note, in some embodiments, the selected point is in a three-dimensional space on the user interface, and, as such, the distance is a three-dimensional distance being minimized in a three-dimensional space.

The method 200 then proceeds to step 250 (of FIG. 2B), where the user may digitize the selected point at the location currently shown in the tunnel preview (i.e., at the minimum distance location). For example, if the tunnel preview constrained the selected point in the tunnel preview from updating to the location pointed to by the pointing device because the location would cause the segment and connected, adjacent segment to have a turning radius below the turning radius limit, then the system digitizes the selected point at the constrained location in the tunnel preview. The selection of the current location further results in the system digitizing the one or more objects defined by the selected point according to the respective previewed placement of the one or more objects. The digitizing updates the visual model to display the one or more objects according to the previewed placement. Then, at step 255 (of FIG. 2B), the system updates the tunnel design in memory to reflect the addition of the object or the new location of the object as shown in the tunnel preview. If the user chooses to continue adding or moving more tunnel objects, the system continues to repeat the method 200, starting at step 205 (of FIG. 2A), until a visual model of a desired tunnel is digitized at the system interface, and the corresponding tunnel design is updated in memory.

Tunnel Design Parameters

FIGS. 3A-3E illustrates example user interfaces for configuring requisite tunnel design parameters used in embodiments of the present invention. FIG. 3A illustrates an example user interface for configuring the tolerances for the gradient limits for tunnel segments. In this example user interface, the user may configure the gradient limits by selecting a percentage for the "minimum±gradient" and "maximum±gradient." FIG. 3B illustrates an example user interface for configuring gradient transition limits between tunnel segments. In this example user interface, the user may configure the tolerances for the gradient transition limits by selecting a percentage for the "maximum+/−transition between tunnel segments" and selecting a value for "minimum transition segment length." In this example, the user may also select (via a checkbox) the option to "automatically smooth vertical transitions." The selection of this checkbox would enable the system to automatically fix a vertical transition between segments (i.e., by smoothing the transition), when the transition does not conform to the configured gradient transition limits.

FIG. 3C illustrates an example user interface for configuring turning radius limits for tunnel segments. In this example user interface, the user may configure the tolerances for turning radius limits by selecting a value for the "minimum turning radius." FIG. 3D illustrates an example user interface for configuring corner angle limit between straight tunnel segments. In this example user interface, the user may configure the tolerances for the corner angle limits by selecting a value in degrees for the "maximum angle between segments." In this example, the user may also select (via a checkbox) the option to "replace with an arc when maximum angle exceeded." The selection of this checkbox would enable the system to automatically fix an angle between segments with an arc, when the angle does not conform to the configured corner angle limit.

FIG. 3E illustrates an example user interface for selecting (via a checkbox) the option to "prevent tunnels from exceeding tunnel parameters and tolerances." The selection of this checkbox would enable the system to prevent a user from creating or modifying a tunnel design in a manner that would fail to conform to tunnel design parameters, such as above-described. In some embodiments, even if this option is selected, the system may still allow a temporary override option that would enable a user, or certain system operations, to make non-conforming tunnel design modifications under occasional, special circumstances.

Using Tunnel Corner Limit Design Parameters

Figure 4A:
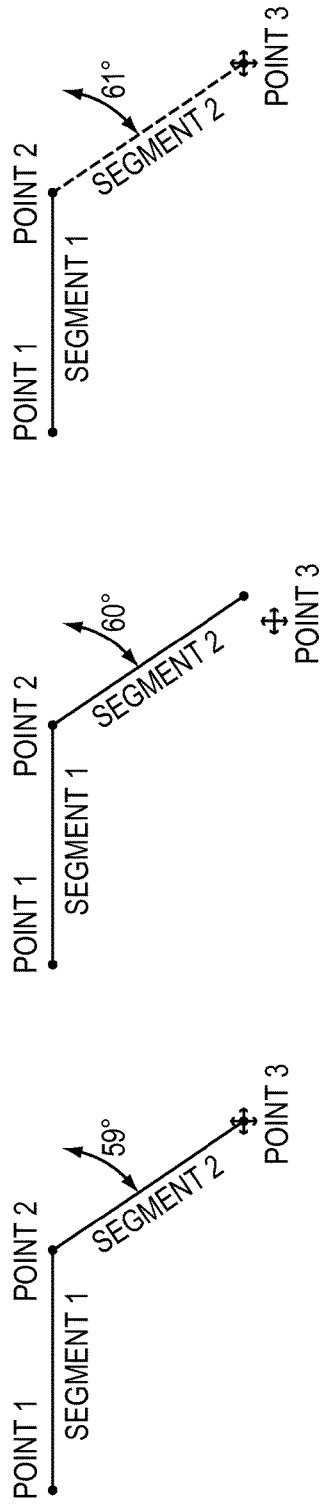
FIGS. 4A-4D are diagrams depicting example methods for using the tunnel corner limit design parameter in embodiments of the present invention.
Figure 4B:
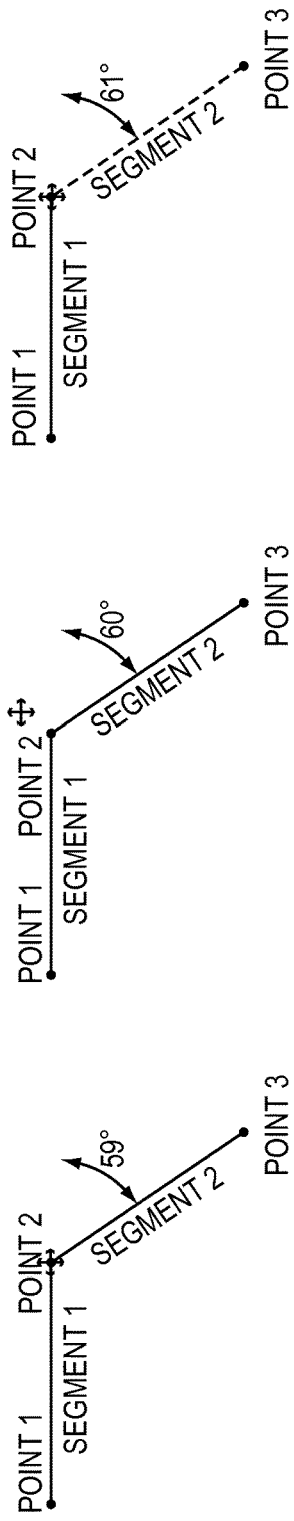

FIGS. 4A and 4B illustrate diagrams depicting example methods for using the tunnel corner limit design parameter in embodiments of the present invention. In FIGS. 4A and 4B, the tunnel corner angle design parameter (maximum horizontal angle between segments) is set to 60 degrees, and the tunnel turning radius limit parameter (minimum turning radius) is set to 20 m. In diagrams 410, 412, and 414 of FIG. 4A, a pointing device, illustrated by the displayed cursor, is being used to move a new point (Point 3) for placement in a visual model of a tunnel design. The placement of new Point 3 would define a new segment (Segment 2), which is being placed between Point 3 and the endpoint of existing Segment 1 (Point 2). In diagram 410 of FIG. 4A, the preview of the placement of Point 3 shows that the respective placement of Segment 2 creates a 59 degree horizontal angle between Segment 1 and Segment 2. As the 59 degree angle does not exceed the specified maximum horizontal angle between segments of 60 degrees, the placement of Segment 2 conforms to the tunnel corner angle design parameter. Further, the turning radius limit design parameter is not considered, as the visual model of the tunnel design does not include, or need to be updated to include, an arc. Thus, as the placement of Segment 2 conforms to all configured tunnel design parameters, the location of the pointing device is tracked within the tunnel preview (i.e., there is no reason to constrain the preview from updating to the location of the pointing device, as it conforms to all the tunnel design parameters).

Figure 4C:
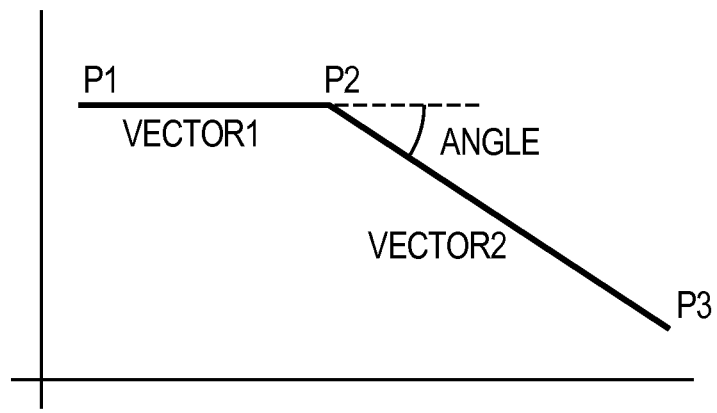

Note, to check the maximum horizontal angle between segments, the angle between the two segments (Segment 1 and Segment 2) may be calculated as shown in FIG. 4C. That is, as shown in FIG. 4C, since Segment 1 is made up of the points "P1" (Point 1) and "P2" (Point 2) and Segment 2 is made up of the points "P2" (Point 2) and "P3" (Point 3), two corresponding vectors may be calculated from the points: Vector1=$\{X_{P2}-X_{P1}, Y_{P2}-Y_{P1}, Z_{P2}-Z_{P1}\}$ and Vector2=$\{X_{P3}-X_{P2}, Y_{P3}-Y_{P2}, Z_{P3}-Z_{P2}\}$. The horizontal angle between the vectors can then be determined by the algorithm: Angle=acos((Vector1■Vector2)/(length(Vector1) *(length(Vector2))), where length(vector) is defined as length=$\sqrt{x^2+y^2+z^2}$, and may be used to detect whether the angle between the corresponding segments exceed the maximum horizontal angle.

In diagram 412 of FIG. 4A, the pointing device attempts to move Point 3, such that the corresponding placement of Segment 2 would create a horizontal angle between Segment 2 and Segment 3 of 61 degrees (the cursor shown at the below-left of Point 3 indicates the attempted movement to 61 degrees which is not displayed). As such, the placement of Point 3 would not conform to the tunnel corner angle limits design parameter, as the corresponding placement of Segment 2 would create a horizontal angle between Segment 1 and Segment 2 that would exceed the specified maximum horizontal angle between segments of 60 degrees. As the "prevent tunnels from exceeding tunnel parameters and tolerances" option is set to "ON" in diagram 412, the preview is constrained from updating to this placement of Point 3. That is, the pointing device is placed at the attempted location, but in the preview, Point 3 will be constrained to a location in which the maximum allowable horizontal angle between Segment 2 and Segment 3 does not exceed 60 degrees. To calculate a location for Point 3 in this scenario, the system will minimize the distance between the location of the pointing device and the constrained location in the preview.

Figure 4D:
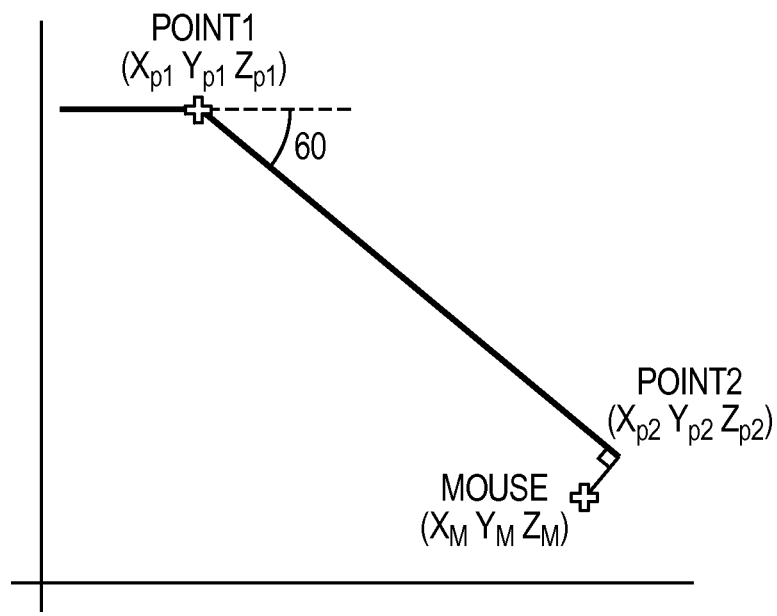

Note, the system may minimize the distance between the pointing device and the constrained location as shown in FIG. 4D. The minimum distance between two points is along the straight line connecting the two points. As in FIG. 412, the two points (Point 1 and Point 2) need to be along a first vector with 60 degrees offset from the placement of an original vector defined by the points (Segment 1). As such, the minimum distance is found along a straight line at right angles to a desired second vector defined from Point 1 ($X_{P1}$, $Y_{P1}$, $Z_{P1}$) to the coordinate of the mouse pointing device ($X_M$, $Y_M$, $Z_M$) at right angles to the first vector. As shown in FIG. 4D, using the first vector and the second vector, the output coordinates $X_{P2}$, $Y_{P2}$, $Z_{P2}$ can be determined by the dot product of the first and second vectors, which is then multiplied against the original vector. The output coordinate (i.e., minimized distance) will lie along the constrained vector, perpendicular to the mouse pointing device coordinates ($X_M$, $Y_M$, $Z_M$), and may be used to place the segment (Segment 1) at a constrained location.

In diagram 414 of FIG. 4A, as in diagram 412, the pointing device attempts to move Point 3, such that the corresponding placement of Segment 2 would create a horizontal angle between Segment 1 and Segment 2 of 61 degrees. However, in diagram 414, the "prevent tunnels from exceeding tunnel parameters and tolerances" option is set to "OFF". In addition, in diagram 414, the "automatically replace corner angle with arc when maximum exceeded" option is set to "OFF," which disables the system from automatically fixing a non-conforming corner angle by replacing it with an arc. As such, the system is not configured to constrain the preview or to fix the corner angle in the preview, so the location of the pointing device moving Point 3 is tracked within the preview, even though the placement of Point 3 at that location would create a horizontal angle between Segment 1 and Segment 2 that exceeds the tunnel corner angle limits. Rather, the system visually indicates in the preview the portion of the visual model that does not conform to the tunnel corner limit design parameter. In diagram 414, the system highlights (dotted) in the preview Segment 2, and the 61 degree angle created by the placement of Segment 2, to illustrate that the placement of Segment 2 fails to conform to the tunnel corner limit design parameter.

In diagrams 420, 422, and 424 of FIG. 4B, Point 2 is a vertex between existing Segment 1 and Segment 2 of the visual model. The pointing device in diagrams 420, 422, and 424 is being used to move Point 2 for placement within the visual model. The placement of Point 2 would adjust the respective placement of Segment 1 and Segment 2, such that the corner angle between Segment 1 and Segment 2 would also be adjusted. In diagram 420 of FIG. 4B, the preview of the placement of Point 2 shows that the respective adjusted placement of Segments 1 and Segment 2 would create a 59 degree horizontal angle between Segment 1 and Segment 2. As the 59 degree angle does not exceed the specified maximum horizontal angle between segments of 60 degrees, the placement of Point 2 would conform to the tunnel corner angle limit design parameter. Thus, as the placement of Point 2 would conform to all configured tunnel design parameters, the location of the pointing device is tracked within the tunnel preview (i.e., there is no reason to constrain the preview from updating to the location of the pointing device, as it conforms to all the tunnel design parameters).

In diagram 422 of FIG. 4B, the pointing device attempts to move Point 2, such that the corresponding placement of Segment 1 and Segment 2 would create a horizontal adjacent angle of 61 degrees (the cursor shown at the above-right of Point 2 indicates the attempted movement to 61 degrees which is not displayed). As such, the placement of Point 2 would not conform to the tunnel corner angle limit design parameter, as the horizontal angle between Segment 1 and Segment 2 would exceed the specified maximum horizontal angle between segments of 60 degrees. As the "prevent tunnels from exceeding tunnel parameters and tolerances" option is set to "ON" in diagram 422, the preview is constrained from updating to this placement of Point 2. That is, the pointing device is placed at the attempted location, but in the preview, Point 2 is constrained to a location in which the maximum allowable horizontal angle between Segment 1 and Segment 2 does not exceed 60 degrees. To calculate a location for Point 2 in this scenario, the system will minimize the distance between the location of the pointing device and the constrained location in the preview.

In diagram 424 of FIG. 4B, as in diagram 422, the pointing device is moved to place Point 2, such that the corresponding placement of Segment 1 and Segment 2 would create an adjacent horizontal angle of 61 degrees. However, in diagram 424, the "prevent tunnels from exceeding tunnel parameters and tolerances" option is set to "OFF". In addition, in diagram 424, the "automatically replace corner angle with arc when maximum exceeded" option is set to "OFF" which prevents the system from automatically fixing the corner angle by replacing it with an arc. As such, the system is not configured to constrain the preview or fix the corner angle, so the location of the pointing device moving Point 2 is tracked within the preview, even though the placement of Point 2 at that location would create a horizontal angle between Segment 1 and Segment 2 that exceeds the tunnel corner angle limit. Rather, the system visually indicates the portion of the visual model that does not conform to the tunnel corner limit design parameter. As shown in diagram 414, the system highlights (dotted) in the preview Segment 2 and the 61 degree angle created by the placement of Point 2 to illustrate that the placement of Segment 2 fails to conform to the tunnel corner limit design parameter.

Using Tunnel Gradient Limit Design Parameters

Figure 5A:
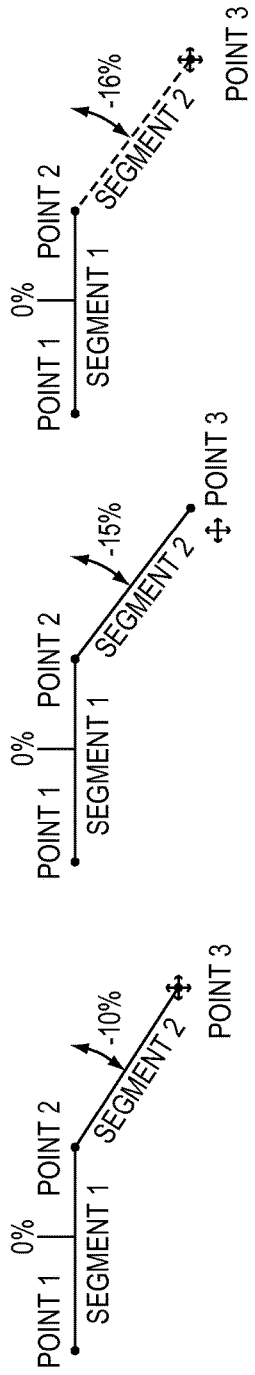
FIGS. 5A-5C are diagrams depicting example methods for using the tunnel gradient limits design parameters in embodiments of the present invention.
Figure 5B:
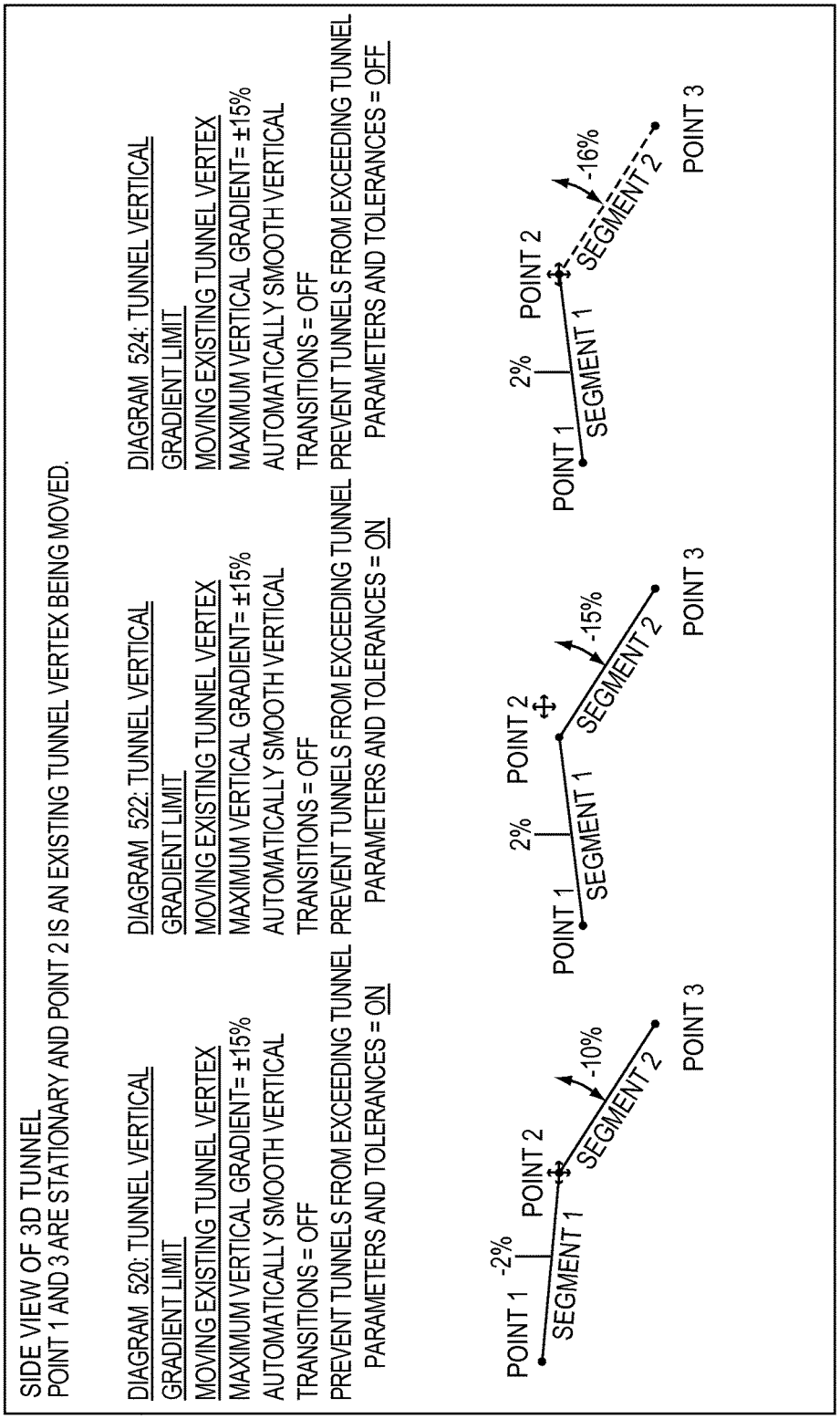

FIGS. 5A and 5B illustrate diagrams depicting example methods for using the gradient limits design parameters in embodiments of the present invention. In FIGS. 5A and 5B, the tunnel gradient limits design parameter (maximum±vertical gradient) is set to ±15%. In diagrams 510, 512, and 514 of FIG. 5A, a pointing device, illustrated by the displayed cursor, is being used to move a new point (Point 3) for placement in a visual model of a tunnel design. The placement of new Point 3 defines a new segment (Segment 2), which is being placed between Point 3 and the endpoint of existing Segment 1 (Point 2). In diagram 510 of FIG. 5A, the preview of the placement of Point 3 shows that the respective placement of Segment 2 creates a −10% vertical gradient between Point 2 and Point 3, by the system performing a real-time rise/run calculation of the Segment 2, and comparing the calculation to the maximum±vertical gradient of ±15%. As the −10% vertical gradient does not exceed the specified maximum±vertical gradient of ±15%, the placement of Segment 2 conforms to the tunnel gradient limits design parameter. Note, in diagram 510, the "automatically smooth vertical transitions" option is set to "OFF", which does not matter in diagram 510, as Point 3 is not placed in a manner that would result in the gradient transition between Segment 1 and Segment 2 requiring smoothing to conform with the gradient transition limits between segments. Thus, as the placement of Segment 2 conforms to all configured tunnel design parameters, the location of the pointing device is tracked within the tunnel preview (i.e., there is no reason to constrain the preview from updating to the location of the pointing device, as it conforms to all the tunnel design parameters).

Figure 5C:
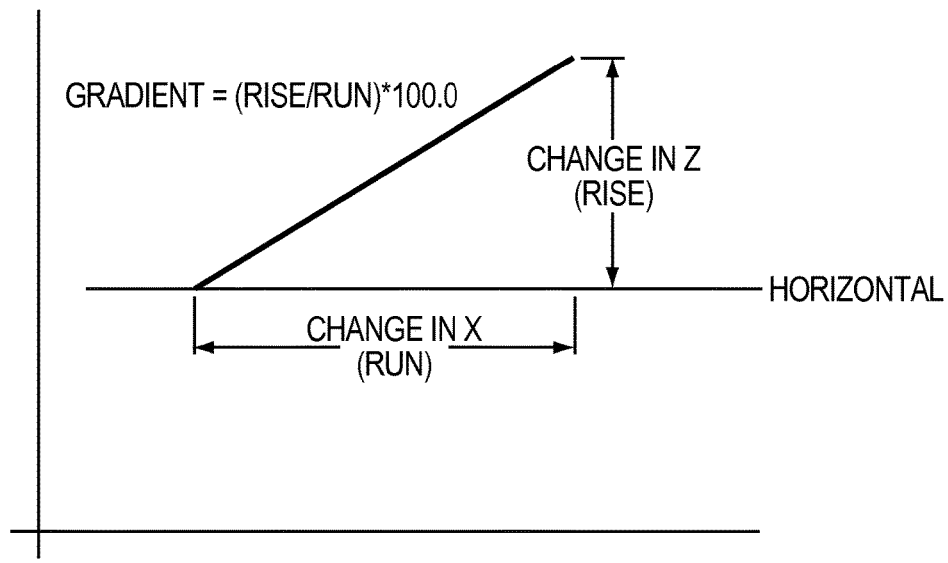

Note, to check the maximum vertical gradient limit, the gradient of a segment may be calculated as shown in FIG. 5C. That is, as shown in FIG. 5C, gradients are angle measurements (represented as a percentage, rather than as decimal degrees/radians). A gradient is calculated using the change in vertical distance divided by the change in horizontal distance. The final value is represented as a percentage (e.g., 45 degrees has a gradient of 100% and 90 degrees has an infinite gradient), and may be used to detect whether the segment (e.g., Segment 2) exceeds the maximum vertical gradient limit.

In diagram 512 of FIG. 5A, the pointing device attempts to move Point 3, such that the corresponding placement of Segment 2 would have a gradient of −16%. As such that the placement of Point 3 would not conform to the tunnel gradient limits design parameter, as the corresponding placement of Segment 2 would exceed the specified maximum±vertical gradient of ±15% (the cursor shown at the below-left of Point 3 indicates the attempted movement to −16% which is not displayed). As the "prevent tunnels from exceeding tunnel parameters and tolerances" option is set to "ON" in diagram 512, the preview is constrained from updating to this placement of Point 3. That is, the pointing device is placed at the attempted location, but in the preview, Point 3 will be constrained to the location which causes the maximum±vertical gradient of Segment 2 to not exceed ±15%. To calculate a location for Point 3 in this scenario, the system will minimize the distance between the location of the pointing device and the constrained location in the preview. Note, the "automatically smooth vertical transitions" option is set to "OFF", so the system would not automatically fix in the preview any vertical gradient transition issues between Segment 1 and Segment 2 (by smoothing) that would be caused by the placement of Segment 3.

In diagram 514 of FIG. 5A, as in diagram 512, the pointing device is moved to place Point 3, such that the corresponding placement of Segment 2 would cause Segment 2 to have a gradient of −16%. Further, in diagram 514 of FIG. 5A, as in diagram 512, the "automatically smooth vertical transitions" option is set to "OFF". However, in diagram 514, the "prevent tunnels from exceeding tunnel parameters and tolerances" option is set to "OFF". As such, the system is not configured to constrain the preview to the tunnel gradient limits, so the location of the pointing device moving Point 3 is tracked within the preview, even though the placement of Point 3 at that location would cause Segment 2 to have a gradient that would exceed the tunnel gradient limits. The system visually indicates the portion of the visual model that does not conform to the tunnel gradient limits design parameter. As shown in diagram 514, the system highlights (dotted) Segment 2 and the −16% gradient created by the placement of Segment 2 to illustrate that the placement of Segment 2 fails to conform to the gradient limits design parameter.

In diagrams 520, 522, and 524 of FIG. 5B, Point 2 is a vertex between existing Segment 1 and Segment 2 of the visual model, rather than a new point as shown in diagrams 510, 512, and 514 of FIG. 5A. The pointing device in diagrams 520, 522, and 524 is being used to move Point 2 for placement within a visual model of a tunnel design. The placement of Point 2 would adjust the placement of Segment 2, such that the gradient of Segment 2 would also be adjusted. In diagram 520 of FIG. 5B, the preview of the placement of Point 2 shows that the respective placement of Segment 2 creates a −10% vertical gradient between Point 2 and Point 3. As the −10% vertical gradient does not exceed the specified maximum±vertical gradient of ±15%, the placement of Segment 2 conforms to the tunnel gradient limits design parameter. Further, the "automatically smooth vertical transitions" option is set to "OFF", which does not matter in diagram 520, as Point 2 is not placed in a manner that results in the gradient transition between Point 2 and Point 3 requiring smoothing to conform with the gradient transition limits between segments. Thus, as the placement of Segment 2 conforms to all configured tunnel design parameters, the location of the pointing device is tracked within the tunnel preview (i.e., there is no reason to constrain the preview from updating to the location of the pointing device, as it conforms to all the tunnel design parameters).

In diagram 522 of FIG. 5B, the pointing device attempts to move Point 2, such that the corresponding placement of Segment 2 would have a gradient of −16%. As such that the placement of Point 2 would not conform to the tunnel gradient limits design parameter, as the corresponding placement of Segment 2 would exceed the specified maximum±vertical gradient of ±15% (the display of the cursor to the above-right of Point 2 indicates the attempted movement to −16% which is not displayed). As the "prevent tunnels from exceeding tunnel parameters and tolerances" option is set to "ON" in diagram 522, the preview is constrained from updating to this placement of Point 2. That is, the pointing device is placed at the attempted location, but in the preview, Point 2 will be constrained to a location in which the vertical gradient of Segment 2 does not exceed ±15%. To calculate a location for Point 2 in this scenario, the system will minimize the distance between the location of the pointing device and the constrained location in the preview.

In diagram 524 of FIG. 5B, as in FIG. 522, the pointing device is moved to place Point 2, such that the corresponding placement of Segment 2 would have a gradient of −16%. However, in diagram 524, the "prevent tunnels from exceeding tunnel parameters and tolerances" option is set to "OFF". Also, the "automatically smooth vertical transitions" option is set to "OFF", so the system does not automatically fix in the preview the vertical gradient transition issues between Point 2 and Point 3 (by smoothing) caused by the placement of Point 2. As such, the system is not configured to constrain the preview in the tunnel gradient limits, so the location of the pointing device moving Point 2 is tracked within the preview, even though the placement of Point 2 at that location would cause Segment 2 to have a gradient that would exceed the tunnel gradient limits. The system visually indicates the portion of the visual model that does not conform to the tunnel gradient limits design parameter. As shown in diagram 524, the system highlights (dotted) in the preview Segment 2 and the −16% gradient created by the placement of Segment 2 to illustrate that the placement of Segment 2 fails to conform to the gradient limits design parameter.

Using Turning Radius Limit Design Parameter

Figure 6A:
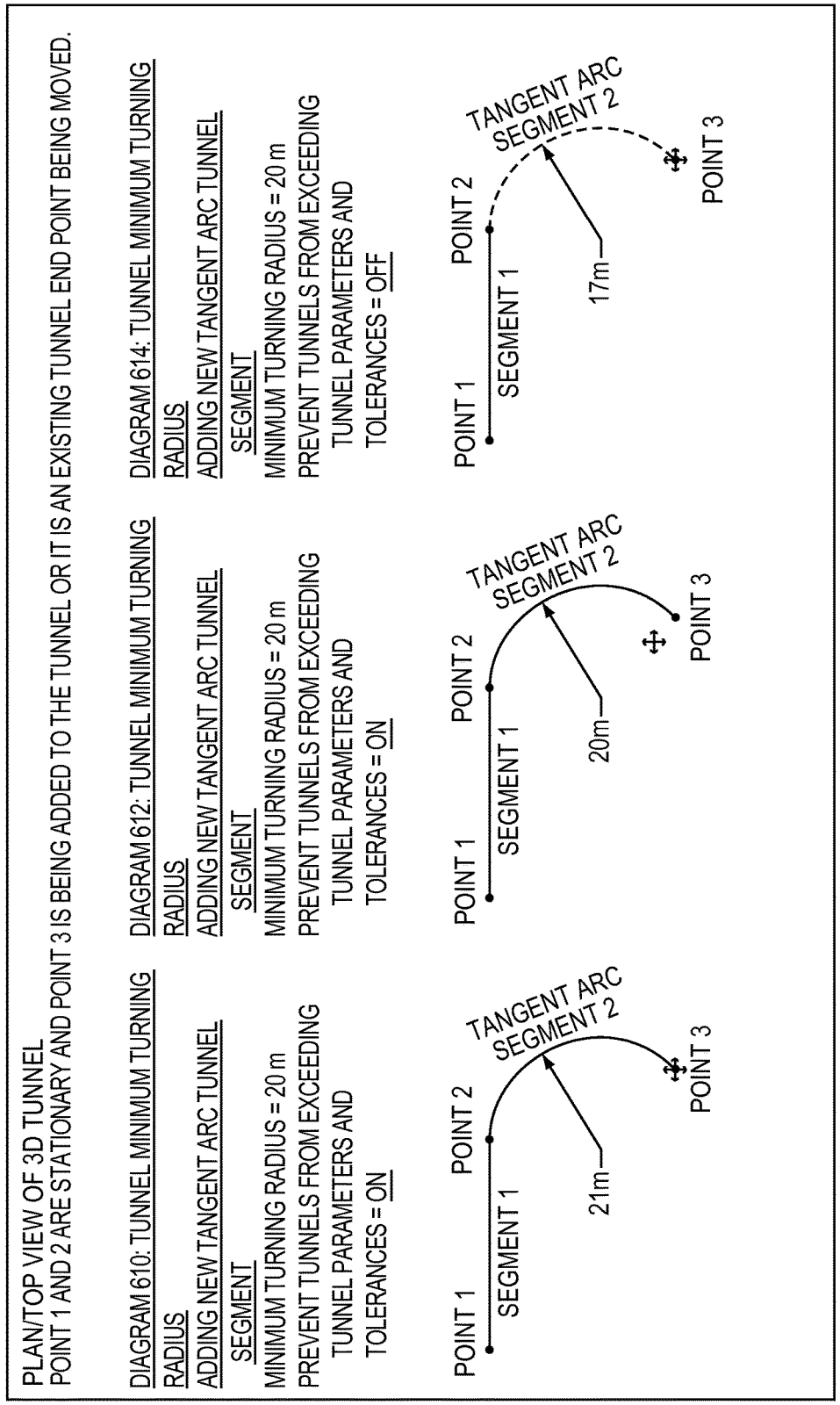
FIGS. 6A and 6B are diagrams depicting example methods for using the tunnel turning radius limit design parameter in embodiments of the present invention.
Figure 6B:
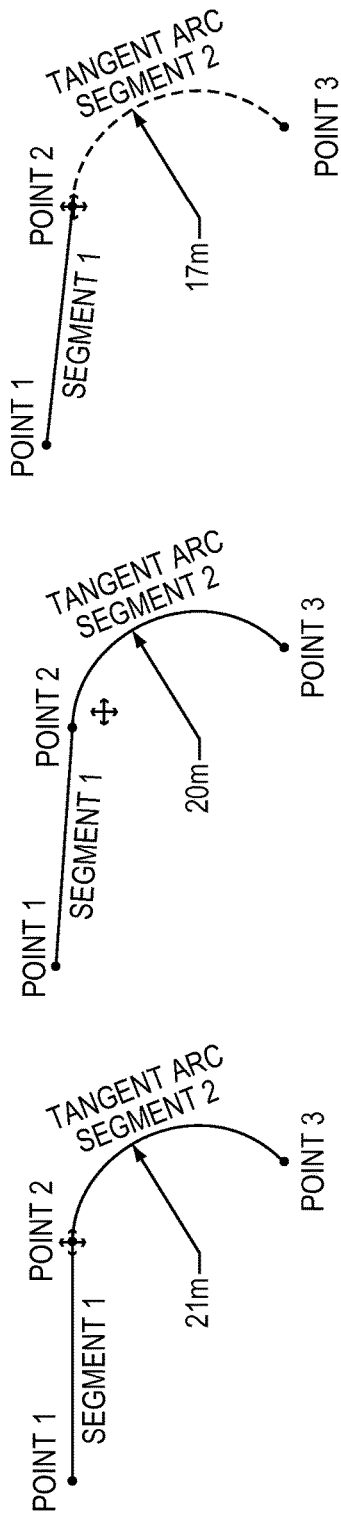

FIGS. 6A and 6B illustrate diagrams depicting example methods for using the tunnel turning radius limit design parameter in embodiments of the present invention. In FIGS. 6A and 6B, the tunnel turning radius limit design parameter (minimum turning radius) is set to 20 m. In diagrams 610, 612, and 614 of FIG. 6A, a pointing device, illustrated by the displayed cursor, is being used to move a new point (Point 3) for placement in a visual model of a tunnel design. The placement of new Point 3 defines a new arc tunnel segment (Segment 2), which is being placed between Point 3 and the endpoint of existing Segment 1 (Point 2). In diagram 610 of FIG. 6A, the preview of the placement of Point 3 shows that the respective placement of Segment 2 would have a turning radius of 21 m. As the 21 m turning radius of Segment 2 would be above the minimum turning radius of 20 m, the placement of Segment 2 conforms to the tunnel turning radius design parameter. Thus, as the placement of Segment 2 conforms to all configured tunnel design parameters, the location of the pointing device is tracked within the tunnel preview (i.e., there is no reason to constrain the preview from updating to the location of the pointing device, as it conforms to all the tunnel design parameters).

In diagram 612 of FIG. 6A, the pointing device attempts to move Point 3, such that the corresponding placement of Segment 2 would cause Segment 2 to have a turning radius of 17 m (the display of the cursor to the above-left of Point 3 indicates the attempted movement to 17 m which is not displayed). As such that the placement of Point 3 would not conform to the tunnel turning radius limit design parameter, as the corresponding placement of Segment 2 would cause Segment 2 to have a turning radius below the specified minimum turning radius of 20 m. As the "prevent tunnels from exceeding tunnel parameters and tolerances" option is set to "ON" in diagram 612, the preview is constrained from updating to this placement of Point 3. That is, the pointing device is placed at the attempted location, but in the preview, Point 3 will be constrained to the location which causes the turning radius of Segment to be below 20 m. To calculate a location for Point 3 in this scenario, the system will minimize the distance between the location of the pointing device and the constrained location in the preview.

In diagram 614 of FIG. 6A, as in diagram 612, the pointing device is moved to place Point 3, such that the corresponding placement of Segment 2 would cause Segment 2 to have a turning radius of 17 m. However, in diagram 614, the "prevent tunnels from exceeding tunnel parameters and tolerances" option is set to "OFF". As such, the system is not configured to constrain the preview within the tunnel turning radius limit, so the location of the pointing device moving Point 3 is tracked within the preview, even though the placement of Point 3 at that location would cause Segment 2 to have a turning radius that would be below the tunnel turning radius limits. The system visually indicates the portion of the visual model that does not conform to the turning radius limit design parameter. As shown in diagram 614, the system highlights in the preview Segment 2 and the 17 m turning radius created by the placement of Segment 2 to illustrate that the placement of Segment 2 fails to conform to the tunnel turning radius limit design parameter.

In diagrams 620, 622, and 624 of FIG. 6B, Point 2 is a vertex between the existing Segment 1 and Segment 2 of the visual model, rather than a new point as shown in diagrams 610, 612, and 614 of FIG. 6A. The pointing device in diagrams 620, 622, and 624 of FIG. 6B is being used to move the existing Point 2 for placement within a visual model of a tunnel design. The placement of Point 2 at a location traversed during the move would adjust the placement of Segment 2, such that the turning radius of Segment 2 would also be adjusted. In diagram 620 of FIG. 6B, the preview of the placement of Point 2 shows that the respective placement of Segment 2 would have a turning radius of 21 m. As the 21 m turning radius of Segment 2 would be above the minimum turning radius of 20 m, the placement of Segment 2 would conform to the tunnel turning radius design parameter. Thus, as the placement of Segment 2 conforms to all configured tunnel design parameters, the location of the pointing device is tracked within the tunnel preview (i.e., there is no reason to constrain the preview from updating to the location of the pointing device, as it conforms to all the tunnel design parameters).

In diagram 622 of FIG. 6B, the pointing device attempts to move Point 2, such that the corresponding placement of Segment 2 would cause Segment 2 to have a turning radius of 17 m. As such that the placement of Point 2 would not conform to the tunnel turning radius limit design parameter, as the corresponding placement of Segment 2 would be below the specified minimum turning radius of 20 m (the display of the cursor to the below-right of Point 2 indicates the attempted movement to 17 m which is not display). As the "prevent tunnels from exceeding tunnel parameters and tolerances" option is set to "ON" in diagram 622, the preview is constrained from updating to this placement of Point 2. That is, the pointing device is placed at the attempted location, but in the preview, Point 2 will be constrained to a location in which the turning radius of Segment 2 remains above 20 m. To calculate a location for Point 2 in this scenario, the system will minimize the distance between the location of the pointing device and the constrained location in the preview.

In diagram 624 of FIG. 6B, as in 622 of FIG. 6B, the pointing device is moved to place Point 2, such that the corresponding placement of Segment 2 would cause a turning radius of 17 m. However, in diagram 624, the "prevent tunnels from exceeding tunnel parameters and tolerances" option is set to "OFF". As such, the system is not configured to constrain the preview within the tunnel turning radius limit, so the location of the pointing device moving Point 2 is tracked within the preview, even though the placement of Point 2 at that location would cause Segment 2 to have a turning radius that would be below the tunnel turning radius limits. The system visually indicates the portion of the visual model that does not conform to the turning radius limit design parameter. As shown in diagram 624, the system highlights (dotted) in the preview Segment 2 and the 17 m turning radius created by the placement of Segment 2 to illustrate that the placement of Segment 2 fails to conform to the tunnel turning radius limit design parameter.

Fixing Tunnel Corner Angles That Exceed Limits

FIGS. 7A and 7B illustrate diagrams 710, 712, 720, 722 depicting example computer methods for fixing tunnel corner angles that exceed tunnel corner angle limit in embodiments of the present invention. In FIGS. 7A and 7B, as in FIGS. 4A and 4B, the tunnel corner angle design parameter (maximum horizontal angle between segments) is set to 60 degrees, and the tunnel turning radius limit parameter (minimum turning radius) is set to 20 m. In diagrams 710 of FIG. 7A and 712 of FIG. 7A, a pointing device, illustrated by the displayed cursor, is being used to move a new point (Point 3) for placement in a visual model of a tunnel design. The placement of new Point 3 defines a new segment (Segment 2), which is being placed between Point 3 and the endpoint of existing Segment 1 (Point 2). In diagram 710 of FIG. 7A, as in diagram 414 of FIG. 4A, the pointing device is traversing a location, such that the corresponding placement of Segment 2 at the location would create a horizontal angle between Segment 1 and Segment 2 of 61 degrees, which exceeds the 60 degree limit.

In diagram 710 of FIG. 7A, as in diagram 414 of FIG. 4A, the "automatically replace corner angle with arc when maximum exceeded" option is set to "OFF", and, as such, the system will not automatically fix the excessive corner angle in the preview by replacing the corner angle with an arc. Further, in diagram 710 of FIG. 7A, as in diagram 414 of FIG. 4A, the "prevent tunnels from exceeding tunnel parameters and tolerances" option is set to "OFF". As such, the system is not configured to constrain the preview with the tunnel corner angle limits, so the location of the pointing device moving Point 3 is tracked within the preview, even though the placement of Point 3 at that location would create a horizontal angle between Segment 1 and Segment 2 that exceeds the tunnel corner angle limits. Rather, the system visually indicates the portion of the visual model that does not conform to the tunnel corner limits design parameter. In diagram 710, as shown in diagram 414 of FIG. 4A, the system highlights (dotted) in the preview Segment 2 and the 61 degree angle created by the placement of Segment 2 to illustrate that the placement of Segment 2 fails to conform to the tunnel corner limit design parameter.

Figure 7C:
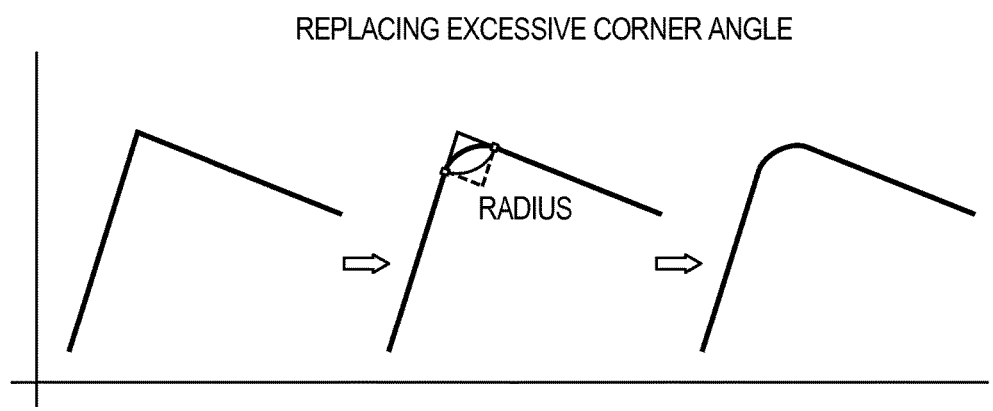

Diagram 712 of FIG. 7A illustrates the same scenario as diagram 710 of FIG. 7A, however, in diagram 712, the "automatically replace corner angle with arc when maximum exceeded" option is set to "ON". As such, the system is configured to replace a corner angle with an arc in the preview, when the corner angle exceeds the tunnel corner angle limit parameter (maximum horizontal angle between segments). In Diagram 712, while the user moves the pointing device over the location that would cause Segment 2 to be placed such that the corner angle between Segment 1 and Segment 2 would be 61 degrees, the system determines in real-time that such a placement exceeds the maximum horizontal angle of 60 degrees, and automatically replaces the angle with an arc in the preview. The replacement arc is formulated to be tangent to the segments that formed the corner angle. As shown in FIG. 7C, the center of the arc is found by solving where the two vectors representing the perpendicular direction of each segment (Segment 1 and Segment 2) intersect at exactly the radius offset distance from the original line segments, and is used to accordingly place the arc replacing the excessive corner angle. If the segments are too short to accommodate the tangent without using a turning radius below the turning radius limit of 20 m, the system would not replace the corner angle in the preview. In diagram 712, Segments 1 and 2 are long enough to accommodate the tangent, and, as such, the replacement of the corner angle with the arc is made in the preview.

With this automatic replacement in the preview, the user can continue to move Point 3 because the placement of Segment 2 is no longer constrained by the tunnel corner angle limit parameter (as Segment 1 is no longer defined by a corner angle, but instead defined by an arc). Further, as the turning radius of the arc is 20 m, the arc conforms to the tunnel turning radius design parameter (minimum turning radius) set to 20 m, and, as such, the visual model in the preview requires no further fixing or constraining in relation to Segment 2. If the user then selects the location using the pointing device, the system digitizes the current location of Point 3 and commits the previewed placement of Segment 2 (with the replaced arc) in the visual model. As such, the tunnel design represented by the visual model conforms to the specified tunnel design parameters.

In diagrams 720 and 722 of FIG. 7B, Point 2 is an existing vertex between existing Segment 1 and Segment 2 of the visual model. The pointing device in diagrams 720 and 722 is being used to move the existing Point 2 within the visual model. The placement of Point 2 at a location traversed during the move would adjust the placement of Segment 1 and Segment 2, such that the corner angle between Segment 1 and Segment 2 would be adjusted. In diagram 720 of FIG. 7B, as in diagram 424 of FIG. 4B, the pointing device is moved to place Point 2, such that the corresponding placement of Segment 1 and Segment 2 would create a horizontal angle of 61 degrees. In diagram 720 of FIG. 7B, as in diagram 424 of FIG. 4B, the "prevent tunnels from exceeding tunnel parameters and tolerances" option is set to "OFF". In addition, in diagram 720, as in diagram 424, the "automatically replace corner angle with arc when maximum exceeded" option is set to "OFF" which prevents the system from automatically fixing the corner angle by replacing it with an arc. As such, the system is not configured to constrain the preview or fix the corner angle, so the location of the pointing device moving Point 2 is tracked within the preview, even though the placement of Point 2 at that location would create a horizontal angle between Segment 1 and Segment 2 that exceeds the tunnel corner angle limits. The system visually indicates the portion of the visual model that does not conform to the tunnel corner limit design parameter. As shown in diagram 720, the system highlights (dotted) in the preview Segment 2 and the 61 degree angle created by the placement of Segment 2 to illustrate that the placement of Segment 2 fails to conform to the tunnel corner limits design parameter.

Diagram 722 of FIG. 7B illustrates the same scenario as diagram 720, however, in diagram 722, the "automatically replace corner angle with arc when maximum exceeded" option is set to "ON". As such, the system is configured to replace a corner angle with an arc in the preview, when the corner angle exceeds the tunnel corner angle limits parameters (maximum horizontal angle between segments). In diagram 722, while the user moves Point 2 over the location that would cause the corner angle between Segment 1 and Segment 2 to be adjusted to 61 degrees, the system determines in real-time that such a placement would exceed the maximum horizontal angle of 60 degrees. The system may then automatically replace the angle with an arc in the preview. The replacement arc is formulated to be tangent to the segments that formed the corner angle. If the segments are too short to accommodate the tangent without using a turning radius below the turning radius limit of 20 m, the system would not replace the corner angle in the preview. In diagram 720, Segments 1 and Segment 2 are long enough to accommodate the tangent, and, as such, the replacement of the corner angle with the arc is made in the preview.

With this automatic replacement in the preview, the user can continue to move Point 2 because the placement of Segment 2 is no longer constrained by the tunnel corner angle limit parameter (as Segment 2 is no longer defined by a corner angle, but instead defined by an arc). Further, as the turning radius of the arc is 20 m, the arc conforms to the tunnel turning radius design parameter (minimum turning radius) set to 20 m, and, as such, the visual model in the preview requires no further fixing or constraining in relation to Segment 2. If the user then selects the location using the pointing device, the system digitizes the current location of Point 2 and commits the previewed placement of Segment 2 (with the replaced arc) in the visual model. As such, the tunnel design represented by the visual model conforms to the specified tunnel design parameters.

With this automatic replacement in the preview, the user can continue to move Point 2 because the placement of Segment 1 and Segment 2 are no longer constrained by the tunnel corner angle limit parameter (as they are no longer defined by a corner angle, but instead defined by an arc). Further, as the turning radius of the arc is 20 m, the arc conforms to the tunnel turning radius design parameter (minimum turning radius) set to 20 m, and, as such, the visual model in the preview requires no further fixing or constraining in relation to Point 2. If the user then selects the location using the pointing device, the system digitizes the current location of Point 2 and commits the previewed placement of Segment 2 (with the replaced arc) in the visual model. As such, the tunnel design represented by the visual model conforms to the specified tunnel design parameters.

Fixing Tunnel Gradient Transitions

Figure 8A:
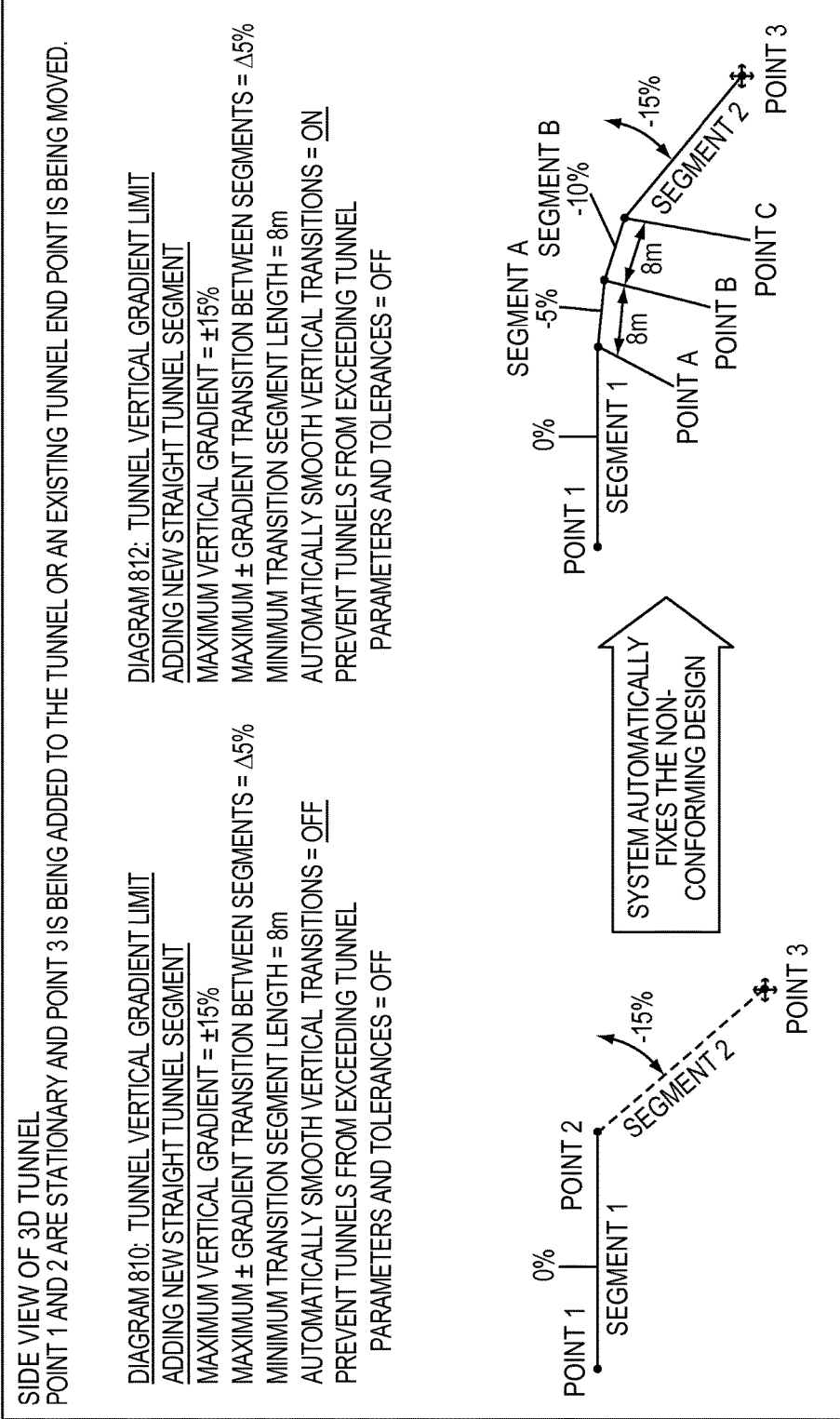
FIGS. 8A-8C are diagrams depicting example methods for fixing tunnel gradient transitions that exceed the gradient transitions limits design parameters in embodiments of the present invention.
Figure 8B:
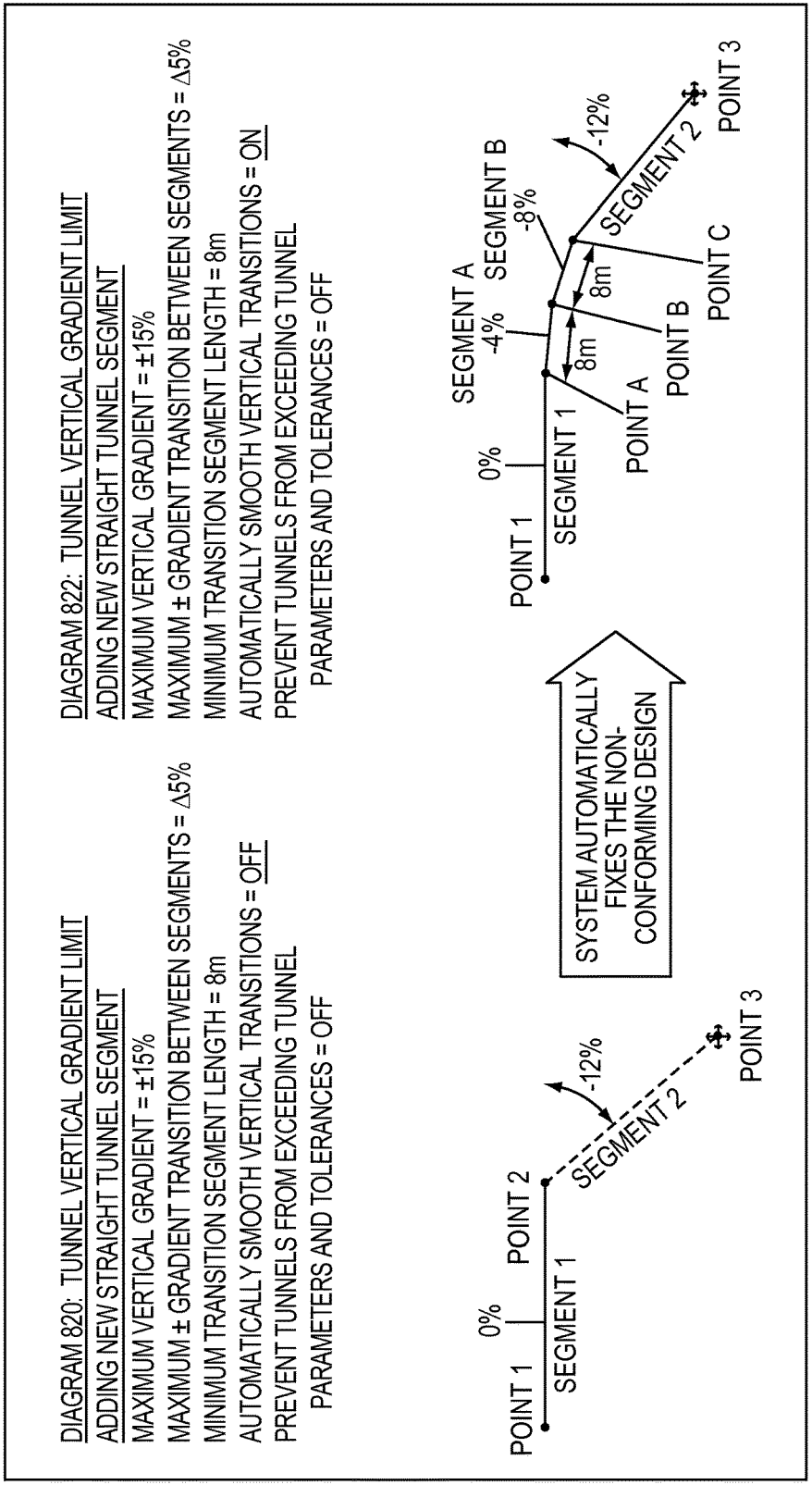
Figure 8C:
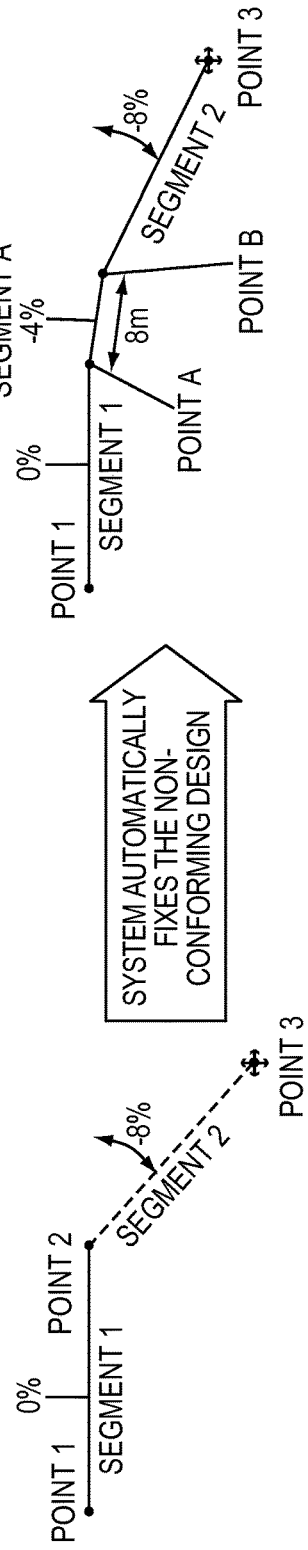

FIGS. 8A-8C illustrate diagrams 810, 812, 820, 822, 830, 832 depicting computer example methods of fixing tunnel gradient transitions in embodiments of the present invention. In FIGS. 8A-8C, the gradient limits parameter (maximum±vertical gradient) is set to ±15% and the gradient transitions limits parameter (maximum±transitions between segments) is set to delta 5%. Moreover, in FIGS. 8A-8C, the "prevent tunnels from exceeding tunnel parameters and tolerances" option is set to "OFF." In diagram 810 of FIG. 8A, 820 of FIG. 8B, and 830 of FIG. 8C, a pointing device, illustrated by the displayed cursor, is being used to move a new point (Point 3) for placement in a visual model of a tunnel design. The placement of new Point 3 defines a new segment (Segment 2), which is being placed between Point 3 and the endpoint of Segment 1 (Point 2). In diagram 810 of FIG. 8A, the preview of the placement of Point 3 shows that the respective placement of Segment 2 creates a vertical gradient of −15% between Segment 1 and Segment 2. In diagram 820 of FIG. 8B, the preview of the placement of Point 3 shows that the respective placement of Segment 2 creates a vertical gradient of −12% between Segment 1 and Segment 2. In diagram 830 of FIG. 8C, the preview of the placement of Point 3 shows that the respective placement of Segment 2 creates a vertical gradient of −8% between Segment 1 and Segment 2. As such, diagrams 810, 820, and 830 exceed the configured maximum±transitions between segments of delta 5%. As the "prevent tunnels from exceeding tunnel parameters and tolerances" and "automatically smooth vertical transitions" options are both set to "OFF," the system is not configured to constrain the preview or fix the non-conforming gradients, so the location of the pointing device is moved to Point 3 within the preview, even though the placement of Point 3 at that location would cause Segment 2 to have a gradient that exceeds the gradient transition limits parameters. Rather, the system visually indicates the portions of the visual models that do not conform to the tunnel gradient transition limits parameters, as shown by highlighting (dotted) Segment 2 and the non-conforming gradients in diagrams 810, 820, and 830

Diagrams 812 of FIG. 8A, 822 of FIG. 8B, and 832 of FIG. 8C illustrate the same scenarios as diagrams 810 of FIG. 8A, 820 of FIG. 8B, and 830 of FIG. 8C, respectively, except, the "automatically smooth vertical transitions" options are now set to "ON." That is, the system is now configured to automatically smooth the excessive gradient transitions in diagrams 812, 822, and 832. As such, in diagrams 812, 822, and 832, the system performs the automatically smoothing of the excessive gradient transitions by breaking the respective excessive transition between Segment 1 and Segment 2 into smaller equal size gradient transitions with the insertion of 8 m long transition segments (as specified by the "minimum transition segment length" parameter set to 8 m). The system calculates the number of minimum length segments (one or more) needed to ensure the maximum±gradient transition between Segment 1 and Segment 2 does not exceed the specified tolerance of delta 5%. The system then inserts the new minimum length segments equalizing the vertical gradient transitions between the segments (Segment 1 and 2). The new segments are connected at equal distances from the current gradient transition point.

To calculate the number of minimum length segments: number of minimum length segments=Ceiling (Absolute (current gradient transition between segments)/maximum±gradient transition between segments)−1. Note, in FIGS. 8A-8C, the maximum±gradient transition between segments is set to delta 5%.

To calculate the new gradient transition between segments: new gradient transitions segments=current gradient transition/(minimum transition segment length+1). Note, in FIGS. 8A-8C, the minimum transition segment length=8 m.

In this way, in diagram 812 of FIG. 8A, two new segments (Segment A and Segment B) are automatically generated to smooth the vertical transitions. They are calculated based on the following: Segment 1=0% gradient, Segment 2=−15% gradients, current gradient transition between the 2 tunnel segments=−15%, Number of required minimum length segments=Ceiling (Absolute (−15%)\5%)−1=2. The new gradient transition between the segments will be=−15%/(2+1)=−5%. The gradient of the new segments will be: Segment A=−5% and Segment B=−10%.

In diagram 822 of FIG. 8B, two new segments (Segment A and Segment B) are automatically generated to smooth the vertical transitions. They are calculated based on the following: Segment 1=0% gradient, Segment 2=−12% gradients, current gradient transition between the 2 tunnel segments=−12%, number of required minimum length segments=Ceiling (Absolute (−12%)\5%)−1=2. The new gradient transition between the segments will be=−12%/(2+1)=−4%. The gradient of the new segments will be: Segment A=−4% and Segment B=−8%.

In diagram 832 of FIG. 8C, one new segment (Segment A) is automatically generated to smooth the vertical transitions. They are calculated based on the following: Segment 1=0% gradient, Segment 2=−8% gradients, Current gradient transition between the 2 tunnel segments=−8%, Number of required minimum length segments=Ceiling (Absolute (−8%)\5%)−1=1. The new gradient transition between the segments will be=−8%/(1+1)=−4%. The gradient of the new segments will be: Segment A=−4%.

With these automatic replacements in the preview, the user can continue to move Point 3 because the placement of Segment 2 is no longer constrained by the gradient limits and gradient transition limits parameters. If the user then selects the location using the pointing device, the system digitizes the current location of Point 3 and commits the previewed placement of Segment 2 (and the new Segments A and B in diagrams 812 and 822 and new Segment A in diagram 832) in the visual model. As such, the tunnel designs represented by the visual model in FIGS. 8A-8C conform to the specified tunnel design parameters.

Digital Processing Environment

Figure 9:
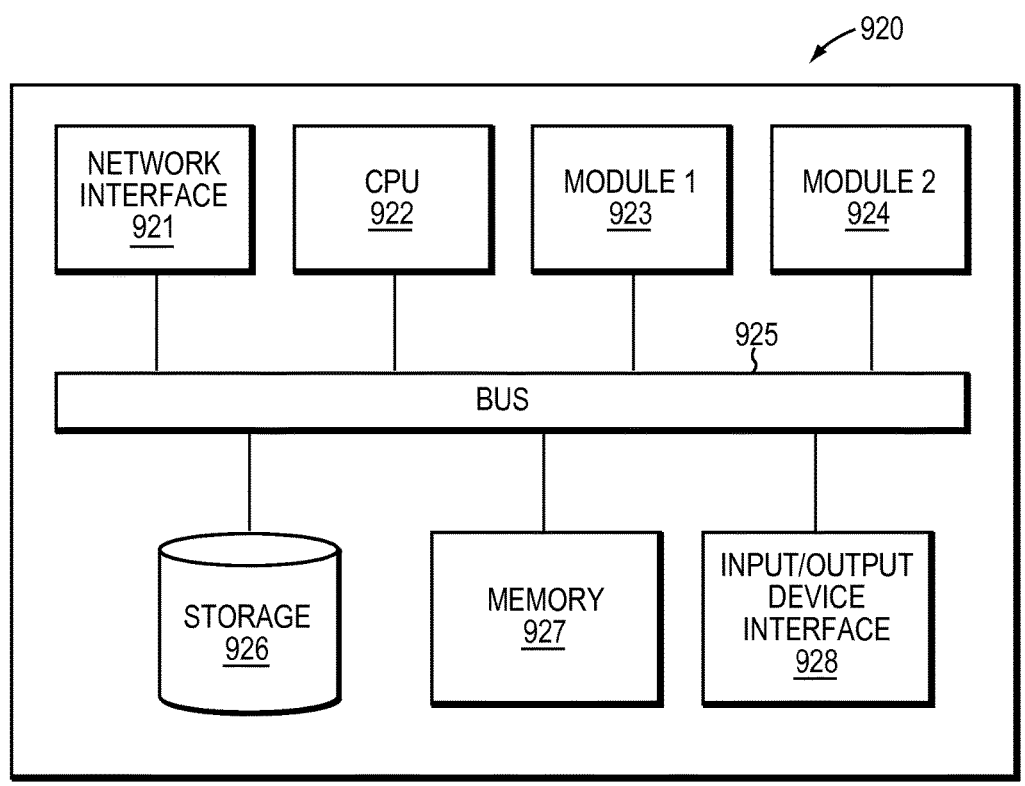
FIG. 9 is a block diagram of a computer (or digital processing) system for performing tunnel design in embodiments of the present invention.

FIG. 9 is a simplified block diagram of a computer-based system 920 that may be used to design tunnels in a document (design system file) according to an embodiment of the present invention. The system 920 comprises a bus 925. The bus 925 serves as an interconnector between the various components of the system 920. Connected to the bus 925 is an input/output device interface 928 for connecting various input and output devices such as a keyboard, mouse, display, speakers, etc. to the system 920. A central processing unit (CPU) 922 is connected to the bus 925 and provides for the execution of computer instructions. Memory 927 provides volatile storage for data used for carrying out computer instructions. Storage 926 provides non-volatile storage for software instructions, such as an operating system (not shown). In particular, memory 927 and/or storage 926 are configured with program instructions implementing (a) methods 100-200 for designing tunnels detailed above in FIGS. 1A-2B, (b) user interface of FIGS. 3A-3E, and (c) operations of FIGS. 4A-8C. The system 920 also comprises a network interface 921 for connecting to any variety of networks known in the art, including cloud, wide area networks (WANs) and local area networks (LANs).

Further connected to the bus 925 is a first module 923. The first module 923 is configured to load a tunnel design as a visual model on a user interface. The first module 923 may provide loading functions through any means known in the art. For example, the first module 923 may reference tunnel design data that is stored on the storage device 926 or memory 927. For further example, the first module 923 may load the tunnel design from any point communicatively coupled to the system 920 via the network interface 921 and/or input/output device interface 928.

The system 920 further comprises a second module 924 that is communicatively/operatively coupled to the first module 923. The second module 924 is configured to provide a real-time tunnel preview of additions or modification being made to the visual model of the tunnel design. The second module 924 may provide real-time functions through any means known in the art. For example, the second module 924 may store real-time display data (e.g., pixel data) for the visual model, on the storage device 926 or memory 927. For another example, the second module 924 may calculate whether the placement of objects in the real-time preview conform to tunnel design parameters by means of the CPU 922 via the bus 925. For further example, the second module 924 may buffer the real-time preview from any point communicatively coupled to the system 920 via the network interface 921 and/or input/output device interface 928.

It should be understood that the example embodiments described herein may be implemented in many different ways. In some instances, the various methods and machines described herein may each be implemented by a physical, virtual, or hybrid general purpose computer, such as the computer system 920. The computer system 920 may be transformed into the machines that execute the methods described herein, for example, by loading software instructions into either memory 927 or non-volatile storage 926 for execution by the CPU 922. Further, while the first module 923 and second module 924 are shown as separate modules, in an example embodiment these modules may be implemented using a variety of configurations.

The system 920 and its various components may be configured to carry out any embodiments of the present invention described herein. For example, the system 920 may be configured to carry out the methods 100-200 described hereinabove in relation to FIGS. 1A-2B, and the supporting user interface and operations of FIGS. 3A-8C. In an example embodiment, the first module 923 and second module 924 may be implemented in software that is stored on the memory 927 and/or storage device 926. In such an example embodiment, the CPU 922 and the memory 927 with computer code instructions stored on the memory 927 and/or storage device 926 implement a first module that loads a tunnel design as a visual model. Further, the components of the system 920 implement a second module that is operatively coupled to the first module and configured to provide a real-time preview of additions and modifications to the visual model.

Figure 10:
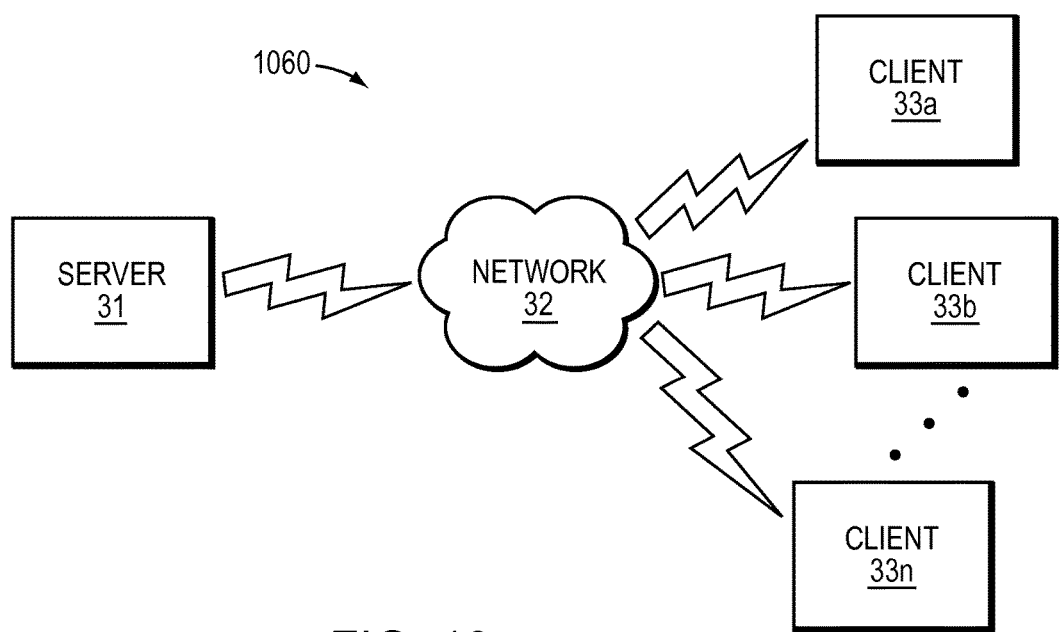
FIG. 10 is a schematic diagram of an example computer network environment in which embodiments of the invention may be implemented.

FIG. 10 illustrates a computer network environment 1060 in which an embodiment of the present invention may be implemented. In the computer network environment 1060, the server 31 is linked through the communications network 32 to the clients 33a-n. The environment 1060 may be used to allow the clients 33a-n, alone or in combination with server 31, to execute any of the methods described hereinabove. It should be understood that the example embodiments described above may be implemented in many different ways. In some instances, the various methods and machines described herein may each be implemented by a physical, virtual, or hybrid general purpose computer, or a computer network environment such as the computer environment 1060.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and, thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method of designing a mining tunnel in accordance with tunnel design parameters, the method comprising:
providing at least one tunnel design parameter for a tunnel design;
loading, from computer memory, the tunnel design at a computer system, wherein the tunnel design is presented as a visual model of a respective tunnel, the visual model being displayed on a user interface of the computer system;
receiving user input representative of selection of a point on the user interface, the selected point defining one or more objects of the visual model;
receiving user input representative of movement of the selected point toward a desired location on the user interface, such that the user input causes the selected point to traverse a plurality of locations during the moving;
as the selected point traverses each of the plurality of locations, providing a real-time preview of respective placement of the selected point and the one or more defined objects, the real-time preview displaying visual feedback showing the respective placement of the selected point on the user interface while the user is moving the selected point to and at a selected respective location, wherein as the user moves the selected point, the displayed visual feedback shows in the visual model real-time adjustment of the one or more objects defined by the selected point, and wherein the real-time preview includes a real-time determination of whether the respective placement conforms to the at least one tunnel design parameter;
receiving user input representative of selection of one location of the plurality of previewed locations in a manner that digitizes the selected point at the one selected location, and the digitizing adjusts the one or more defined objects to the respective previewed placement in the visual model as displayed on the user interface; and
updating, in computer memory, the tunnel design to reflect the adjusted placement one or more defined objects.

2. The method of claim 1, wherein the one or more defined objects are one or more modeled tunnel segments, and the selected point is one of: a modeled endpoint of the tunnel segment or a modeled vertex between tunnel segments.

3. The method of claim 1, wherein adjusting the placement of one or more defined objects results in at least one of: extending a defined object, changing angles between defined objects, changing gradient of a defined object, and changing radius of a defined object.

4. The method of claim 1, wherein the at least one tunnel design parameter includes at least one of: gradient limits, gradient transition limits between segments, turning radius limit, and corner angle limit.

5. The method of claim 1, wherein if the real-time determination indicates that the respective placement fails to conform to the at least one tunnel design parameter, the method further comprises performing, in the display on the user interface, at least one of:

preventing the preview on the user interface from updating to the traversed location;

automatically fixing, in the preview on the user interface, the respective placement of the one or more defined objects to conform with the at least one tunnel design parameter, or visually indicating, in the preview on the user interface, the one or more defined objects that fails to conform to the at least one tunnel design parameter.

6. The method of claim 5, wherein the automatically fixing the respective placement includes automatically smoothing a gradient transition, when the gradient transition fails to conform to a gradient transition limits parameter.

7. The method of claim 5, wherein the automatically fixing the respective placement includes automatically replacing a corner angle with an arc, when the corner angle fails to conform to a corner angle limits parameter.

8. The method of claim 1, wherein if the adjusted placement of the one or more defined objects fails to conform to the at least one tunnel design parameters, visually indicate on the user interface, the failure in a respective portion of the visual model.

9. The method of claim 1, wherein the selected point defines: a new object being added to the visual model, or an existing object being modified in the visual model.

10. The method of claim 1, wherein the visual model is a three-dimensional visual model.

11. A computer system for designing a tunnel in accordance with tunnel design parameters, the method comprising:

at least one processor communicatively coupled to a user interface, the at least one processor configured to:
provide at least one tunnel design parameter for a tunnel design;
load, from memory communicatively coupled to the at least processor, the tunnel design, wherein the tunnel design is presented as a visual model of a respective tunnel, the visual model being displayed on the user interface;

the user interface configured to enable a user to:
select a point on the user interface, the selected point defining one or more objects of the visual model,
move the selected point toward a desired location on the user interface, such that the selected point traverses a plurality of locations during the moving, and select one location;

the at least one processor further configured to:
as the selected point traverses each of the plurality of locations, provide a real-time preview on the user interface of respective placement of the selected point and the one or more defined objects, the real-time preview displaying visual feedback showing the respective placement of the selected point on the user interface while the user is moving the selected point to and at a selected respective location, wherein as the user moves the selected point, the displayed visual feedback shows in the visual model real-time adjustment of the one or more objects defined by the selected point, and wherein the real-time preview includes a real-time determination of whether the respective placement conforms to the at least one tunnel design parameter;

when the user selects one location of the plurality of previewed locations, digitize the selected point at the one selected location by adjusting the one or more defined objects to the respective previewed placement in the visual model as displayed on the user interface; and update, in the memory, the tunnel design to reflect the adjusted placement one or more defined objects.

12. The computer system of claim 11, wherein the one or more defined objects are one or more modeled tunnel segments, and the selected point is one of: a modeled endpoint of the tunnel segment or a modeled vertex between tunnel segments.

13. The computer system of claim 11, wherein adjusting the placement of the one or more defined objects results in at least one of: extending a defined object, changing angles between defined objects, changing gradient of a defined object, and changing radius of a defined object.

14. The computer system of claim 11, wherein the at least one tunnel design parameter includes at least one of: gradient limits, gradient transition limits between segments, turning radius limit, and corner angle limit.

15. The computer system of claim 11, wherein if the real-time determination indicates that the respective placement fails to conform to the at least one tunnel design parameter, the at least one processor performing, in real-time, in the display on the user interface, at least one of:

preventing the preview on the user interface from updating to the traversed location;

automatically fixing, in the preview on the user interface, the respective placement of the one or more defined objects to conform with the at least one tunnel design parameter, or visually indicating, in the preview on the user interface, the one or more defined objects that fails to conform to the at least one tunnel design parameter.

16. The computer system of claim 15, wherein the at least one processor is configured to automatically fix the respective placement by automatically smoothing a gradient transition, when the gradient transition fails to conform to a gradient transition limits parameter.

17. The computer system of claim 15, wherein the at least one processor is configured to automatically fix the respective placement by automatically replacing a corner angle with an arc, when the corner angle fails to conform to a corner angle limits parameter.

18. The computer system of claim 11, wherein if the adjusted placement of the one or more defined objects fails to conform to the at least one tunnel design parameters, the at least one processor visually indicates on the user interface, the failure in a respective portion of the visual model.

19. The computer system of claim 11, wherein the selected point defines: a new object being added to the visual model, or an existing object being modified in the visual model.

20. The computer system of claim 11, wherein the visual model is a three-dimensional visual model.

* * * * *